(12) United States Patent
Park et al.

(10) Patent No.: US 10,128,336 B2
(45) Date of Patent: Nov. 13, 2018

(54) SEMICONDUCTOR DEVICES AND METHODS FOR MANUFACTURING THE SAME

(71) Applicants: Sangjine Park, Yongin-si (KR); Boun Yoon, Seoul (KR); Jeongnam Han, Seoul (KR)

(72) Inventors: Sangjine Park, Yongin-si (KR); Boun Yoon, Seoul (KR); Jeongnam Han, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/009,119

(22) Filed: Jan. 28, 2016

(65) Prior Publication Data

US 2016/0163798 A1 Jun. 9, 2016

Related U.S. Application Data

(63) Continuation of application No. 13/192,939, filed on Jul. 28, 2011.

(30) Foreign Application Priority Data

Oct. 7, 2010 (KR) .......................... 10-2010-0097922

(51) Int. Cl.
*H01L 29/66* (2006.01)
*H01L 29/08* (2006.01)
(Continued)

(52) U.S. Cl.
CPC .. *H01L 29/0847* (2013.01); *H01L 21/823425* (2013.01); *H01L 21/823468* (2013.01);
(Continued)

(58) Field of Classification Search
CPC ......... H01L 21/823468; H01L 29/0847; H01L 29/45; H01L 29/7833; H01L 29/7848
(Continued)

(56) References Cited

U.S. PATENT DOCUMENTS 4,981,810 A * 1/1991 Fazan ................. H01L 29/6659
257/900
5,234,852 A * 8/1993 Liou ..................... H01L 21/266
148/DIG. 133

(Continued)

FOREIGN PATENT DOCUMENTS

JP 2008034413 A 2/2008
KR 1020030057892 7/2003
(Continued)

OTHER PUBLICATIONS

U.S. Office Action dated Sep. 30, 2016 issued in co-pending U.S. Appl. No. 15/010,470.
(Continued)

*Primary Examiner* — Jay C Kim
(74) *Attorney, Agent, or Firm* — Harness, Dickey & Pierce, P.L.C.

(57) ABSTRACT

Semiconductor devices and methods of manufacturing semiconductor devices. A semiconductor device includes a metal gate electrode stacked on a semiconductor substrate with a gate insulation layer disposed therebetween, spacer structures disposed on the semiconductor substrate at both sides of the metal gate electrode, source/drain regions formed in the semiconductor substrate at the both sides of the metal gate electrode, and an etch stop pattern including a bottom portion covering the source/drain regions and a sidewall portion extended from the bottom portion to cover a portion of sidewalls of the spacer structures, in which an upper surface of the sidewall portion of the etch stop pattern is
(Continued)

positioned under an upper surface of the metal gate electrode.

22 Claims, 15 Drawing Sheets

(51) Int. Cl.
  H01L 21/8234 (2006.01)
  H01L 29/78 (2006.01)
  H01L 23/535 (2006.01)
  H01L 29/16 (2006.01)
  H01L 29/165 (2006.01)
  H01L 29/45 (2006.01)
  H01L 29/417 (2006.01)

(52) U.S. Cl.
  CPC .... *H01L 21/823475* (2013.01); *H01L 23/535* (2013.01); *H01L 29/165* (2013.01); *H01L 29/1608* (2013.01); *H01L 29/41783* (2013.01); *H01L 29/45* (2013.01); *H01L 29/6656* (2013.01); *H01L 29/66545* (2013.01); *H01L 29/7833* (2013.01); *H01L 29/7843* (2013.01); *H01L 29/7848* (2013.01); *H01L 29/6659* (2013.01); *H01L 2924/0002* (2013.01)

(58) Field of Classification Search
  USPC .......................................................... 257/192
  See application file for complete search history.

(56) References Cited

U.S. PATENT DOCUMENTS

| | | | | |
|---|---|---|---|---|
| 5,372,960 A * | 12/1994 | Davies | ................ | H01L 29/1045 |
| | | | | 257/E21.427 |
| 5,428,240 A * | 6/1995 | Lur | ....................... | H01L 21/266 |
| | | | | 257/389 |
| 5,541,132 A * | 7/1996 | Davies | ............ | H01L 21/823814 |
| | | | | 257/E21.427 |
| 5,573,965 A * | 11/1996 | Chen | ................ | H01L 21/28176 |
| | | | | 257/E21.194 |
| 5,629,230 A * | 5/1997 | Fazan | .................... | H01L 21/32 |
| | | | | 257/E21.258 |
| 5,650,343 A * | 7/1997 | Luning | ................ | H01L 21/266 |
| | | | | 257/E21.205 |
| 5,731,239 A | 3/1998 | Wong et al. | | |
| 5,783,475 A * | 7/1998 | Ramaswami | ......... | H01L 29/665 |
| | | | | 257/E21.438 |
| 5,960,270 A | 9/1999 | Misra et al. | | |
| 6,144,071 A * | 11/2000 | Gardner | ............. | H01L 29/4983 |
| | | | | 257/344 |
| 6,171,910 B1 | 1/2001 | Hobbs et al. | | |
| 6,218,275 B1 * | 4/2001 | Huang | ............. | H01L 21/76897 |
| | | | | 257/E21.507 |
| 6,228,730 B1 * | 5/2001 | Chen | ................ | H01L 21/28518 |
| | | | | 257/E21.165 |
| 6,287,951 B1 | 9/2001 | Lucas et al. | | |
| 6,346,450 B1 * | 2/2002 | Deleonibus | ....... | H01L 21/28088 |
| | | | | 257/E21.204 |
| 6,440,875 B1 * | 8/2002 | Chan | .................. | H01L 21/31116 |
| | | | | 257/E21.252 |
| 6,455,383 B1 * | 9/2002 | Wu | .................... | H01L 21/28061 |
| | | | | 257/E21.2 |
| 6,551,887 B2 * | 4/2003 | Kwon | ................. | H01L 29/6653 |
| | | | | 257/E29.266 |
| 6,562,717 B1 * | 5/2003 | Woo | ................. | H01L 21/28518 |
| | | | | 257/E21.165 |
| 6,632,714 B2 * | 10/2003 | Yoshikawa | ......... | G11C 11/5671 |
| | | | | 257/E21.21 |
| 6,642,590 B1 * | 11/2003 | Besser | ................ | H01L 29/4941 |
| | | | | 257/410 |
| 6,753,242 B2 * | 6/2004 | Yeap | ................. | H01L 21/28273 |
| | | | | 257/E21.209 |
| 6,764,966 B1 * | 7/2004 | En | ....................... | H01L 29/6656 |
| | | | | 257/E21.423 |
| 6,774,441 B2 * | 8/2004 | Maki | ............... | H01L 21/823425 |
| | | | | 257/377 |
| 6,812,073 B2 * | 11/2004 | Bu | ....................... | H01L 29/6656 |
| | | | | 257/E29.266 |
| 6,815,320 B2 * | 11/2004 | Kim | ................ | H01L 21/823481 |
| | | | | 257/E21.628 |
| 6,838,732 B2 | 1/2005 | Igarashi et al. | | |
| 6,867,128 B2 * | 3/2005 | Deleonibus | ....... | H01L 21/28273 |
| | | | | 257/E21.204 |
| 6,894,353 B2 * | 5/2005 | Samavedam | ... | H01L 21/823814 |
| | | | | 257/365 |
| 6,927,117 B2 * | 8/2005 | Cabral, Jr. | ...... | H01L 21/823835 |
| | | | | 257/E21.636 |
| 6,930,007 B2 * | 8/2005 | Bu | ....................... | H01L 29/0847 |
| | | | | 257/E21.438 |
| 7,008,835 B2 * | 3/2006 | Jin | .................... | H01L 21/28035 |
| | | | | 257/E21.198 |
| 7,018,888 B2 * | 3/2006 | Goodlin | ............. | H01L 29/6656 |
| | | | | 257/E21.438 |
| 7,029,966 B2 | 4/2006 | Amos et al. | | |
| 7,217,626 B2 * | 5/2007 | Bu | ....................... | H01L 29/6653 |
| | | | | 257/E21.438 |
| 7,294,581 B2 | 11/2007 | Iyer et al. | | |
| 7,354,838 B2 * | 4/2008 | Kammler | ......... | H01L 21/823807 |
| | | | | 257/E21.438 |
| 7,402,485 B1 * | 7/2008 | En | ......................... | H01L 29/665 |
| | | | | 438/226 |
| 7,405,116 B2 | 7/2008 | Carter et al. | | |
| 7,411,245 B2 * | 8/2008 | Fang | ................. | H01L 21/28052 |
| | | | | 257/315 |
| 7,446,007 B2 * | 11/2008 | Adkisson | ............ | H01L 29/4983 |
| | | | | 257/E21.205 |
| 7,456,062 B1 * | 11/2008 | En | ......................... | H01L 29/6656 |
| | | | | 257/E21.148 |
| 7,462,915 B2 * | 12/2008 | Yang | .................... | H01L 29/6653 |
| | | | | 257/369 |
| 7,495,280 B2 * | 2/2009 | Lo | ....................... | H01L 29/4983 |
| | | | | 257/314 |
| 7,514,331 B2 * | 4/2009 | Yoon | .................. | H01L 29/6653 |
| | | | | 257/E21.626 |
| 7,611,943 B2 * | 11/2009 | Liu | ................... | H01L 21/28097 |
| | | | | 257/E21.051 |
| 7,635,620 B2 * | 12/2009 | Chen | ............... | H01L 21/823807 |
| | | | | 257/288 |
| 7,670,914 B2 * | 3/2010 | Krivokapic | ......... | H01L 29/4238 |
| | | | | 257/E21.431 |
| 7,678,679 B2 * | 3/2010 | Manger | ............. | H01L 21/28247 |
| | | | | 257/E21.626 |
| 7,723,192 B2 | 5/2010 | Carter et al. | | |
| 7,732,283 B2 * | 6/2010 | Lim | .................. | H01L 27/11521 |
| | | | | 257/E21.64 |
| 7,759,206 B2 * | 7/2010 | Luo | ................... | H01L 29/6653 |
| | | | | 257/E21.438 |
| 7,759,262 B2 * | 7/2010 | King | ................ | H01L 21/28052 |
| | | | | 257/E21.19 |
| 7,799,630 B2 * | 9/2010 | Yu | ................... | H01L 21/823842 |
| | | | | 257/E21.474 |
| 7,816,218 B2 * | 10/2010 | Klaus | ................. | H01L 21/31105 |
| | | | | 257/E21.165 |
| 7,829,939 B1 * | 11/2010 | Zhu | ....................... | B82Y 10/00 |
| | | | | 257/327 |
| 7,858,480 B2 * | 12/2010 | Yamasaki | ....... | H01L 21/823412 |
| | | | | 257/369 |
| 7,883,953 B2 | 2/2011 | Zhang et al. | | |
| 7,897,501 B2 * | 3/2011 | Cheng | ................ | H01L 29/6653 |
| | | | | 257/E21.626 |
| 7,915,111 B2 | 3/2011 | Yang et al. | | |
| 7,923,321 B2 * | 4/2011 | Lai | .................. | H01L 21/823842 |
| | | | | 257/E21.434 |
| 7,977,181 B2 * | 7/2011 | Lai | ................. | H01L 21/823842 |
| | | | | 257/E21.023 |
| 7,981,749 B2 | 7/2011 | Balasubramanian | | |
| 8,017,485 B2 * | 9/2011 | Cho | ....................... | H01L 27/105 |
| | | | | 257/E21.18 |

(56) References Cited

U.S. PATENT DOCUMENTS

| | | | | |
|---|---|---|---|---|
| 8,035,165 B2* | 10/2011 | Yeh | H01L 21/823814 | 257/369 |
| 8,048,752 B2* | 11/2011 | Wu | H01L 21/823468 | 257/E21.626 |
| 8,048,790 B2* | 11/2011 | Soss | H01L 21/28114 | 438/585 |
| 8,106,467 B2* | 1/2012 | Shima | H01L 21/823807 | 257/336 |
| 8,198,686 B2 | 6/2012 | Sato et al. | | |
| 8,207,043 B2* | 6/2012 | Lin | H01L 29/7847 | 438/299 |
| 8,278,179 B2* | 10/2012 | Lin | H01L 29/66795 | 257/E21.431 |
| 8,288,802 B2* | 10/2012 | Cheng | H01L 29/6656 | 257/288 |
| 8,298,894 B2* | 10/2012 | Lenski | H01L 21/28088 | 438/199 |
| 8,338,892 B2* | 12/2012 | Kronholz | H01L 21/26586 | 257/368 |
| 8,357,573 B2* | 1/2013 | Kronholz | H01L 21/28088 | 257/327 |
| 8,357,576 B2 | 1/2013 | Chang et al. | | |
| 8,431,453 B2* | 4/2013 | Huang | H01L 27/088 | 257/369 |
| 8,455,952 B2 | 6/2013 | Lin et al. | | |
| 8,470,661 B2* | 6/2013 | Frohberg | H01L 21/28114 | 257/E21.409 |
| 8,557,667 B2 | 10/2013 | Rulke et al. | | |
| 8,609,495 B2* | 12/2013 | Gan | H01L 29/66795 | 257/204 |
| 8,765,561 B2* | 7/2014 | Hung | H01L 21/324 | 257/E21.453 |
| 8,980,753 B2* | 3/2015 | Wang | H01L 21/823842 | 216/47 |
| 2007/0045674 A1 | 3/2007 | Komoda | | |
| 2007/0087575 A1 | 4/2007 | Iyer et al. | | |
| 2008/0023774 A1 | 1/2008 | Sato et al. | | |
| 2008/0087967 A1* | 4/2008 | Kim | H01L 21/823807 | 257/369 |
| 2009/0085075 A1* | 4/2009 | Kim | H01L 21/28044 | 257/288 |
| 2009/0224306 A1* | 9/2009 | Hayashi | H01L 21/28282 | 257/316 |
| 2009/0230463 A1 | 9/2009 | Carter et al. | | |
| 2010/0072523 A1 | 3/2010 | Sato et al. | | |
| 2012/0098043 A1* | 4/2012 | Hsieh | H01L 21/823842 | 257/288 |

FOREIGN PATENT DOCUMENTS

| | | |
|---|---|---|
| KR | 1020040011018 | 2/2004 |
| KR | 1020040011912 | 2/2004 |
| KR | 20060006537 A | 1/2006 |

OTHER PUBLICATIONS

U.S. Office Action dated Jun. 19, 2017 issued in co-pending U.S. Appl. No. 15/010,470.

U.S. Office Action dated Feb. 10, 2017 issued in co-pending U.S. Appl. No. 15/010,470.

* cited by examiner

SEMICONDUCTOR DEVICES AND METHODS FOR MANUFACTURING THE SAME

CROSS-REFERENCE TO RELATED APPLICATIONS

This application is a continuation of U.S. patent application Ser. No. 13/192,939, filed on Jul. 28, 2011, which claims priority under 35 U.S.C. § 119 to Korean Patent Application No. 10-2010-0097922, filed on Oct. 7, 2010, in the Korean Intellectual Property Office (KIPO), the entire contents of each of the above-referenced applications are hereby incorporated by reference.

BACKGROUND

1. Field

Example embodiments relate to semiconductor devices and methods for manufacturing the same.

2. Description of the Related Art

A semiconductor device may include an integrated circuit provided with a plurality of metal oxide semiconductor field effect transistors (MOSFETs). As semiconductor devices are highly integrated, a line width of a gate electrode included in a MOS transistor is reduced. The reduction in the line width of the gate electrode may cause a short channel effect and increase an electrical resistance of the gate electrode to cause a resistance-capacitance (RC) delay.

To solve an increase problem in the sheet resistance and contact resistance of the gate, source and drain of a MOSFET, a process of forming a silicide layer having a low resistivity has been developed. Techniques to form a gate electrode with a metallic material having a low resistivity have been proposed.

SUMMARY

Example embodiments may provide semiconductor devices including a metal gate electrode having a fine line width. Example embodiments may also provide methods for manufacturing semiconductor devices including a metal gate electrode having a fine line width.

Some example embodiments of the inventive concepts provide semiconductor devices including a metal gate electrode stacked on a semiconductor substrate with a gate insulation layer disposed therebetween, spacer structures disposed on the semiconductor substrate at both sides of the metal gate electrode, source/drain regions formed in the semiconductor substrate at the both sides of the metal gate electrode, and an etch stop pattern including a bottom portion covering the source/drain regions and a sidewall portion extended from the bottom portion to cover a portion of a sidewall of the spacer structures, in which an upper surface of the sidewall portion of the etch stop pattern is positioned under an upper surface of the metal gate electrode.

Other example embodiments of the inventive concepts provide methods for manufacturing semiconductor devices including forming a gate stack including a gate insulation pattern, a gate sacrificial pattern and a capping pattern which are sequentially stacked on a semiconductor substrate, forming a spacer structures at both sidewalls of the gate stack, forming source/drain regions in the semiconductor substrate at both sides of the gate stack, forming an etch stop pattern covering the source/drain regions under an upper surface of the gate sacrificial pattern, forming a gap fill insulation layer covering the etch stop pattern but exposing the capping pattern of the gate stack, removing the capping pattern and the gate sacrificial pattern to form a trench between the spacer structures, and forming a metal gate electrode in the trench.

According to further example embodiments, a semiconductor device includes a substrate, a gate insulation layer on the substrate, a metal gate electrode on the gate insulation layer, a plurality of spacer structures on the substrate at sides of the metal gate electrode, source/drain regions in the semiconductor substrate at the sides of the metal gate electrode, and an etch stop pattern including a bottom portion covering the source/drain regions and a sidewall portion extending from the bottom portion to cover at least a part of sidewalls of the spacer structures, an upper surface of the sidewall portion being between the substrate and an upper surface of the metal gate electrode.

According to still other example embodiments, a method of manufacturing a semiconductor device includes forming a gate stack including a gate insulation pattern, a gate sacrificial pattern and a capping pattern on a semiconductor substrate, forming spacer structures at sidewalls of the gate stack, forming source/drain regions in the semiconductor substrate at both sides of the gate stack, forming an etch stop pattern between an upper surface of the gate sacrificial pattern and the substrate such that the source/drain regions are covered, forming a gap fill insulation layer covering the etch stop pattern such that the capping pattern of the gate stack remains exposed, removing the capping pattern and the gate sacrificial pattern to form a trench between the spacer structures, and forming a metal gate electrode in the trench.

According to yet further example embodiments, a semiconductor device includes a first semiconductor layer, a metal gate on the first semiconductor layer, a plurality of spacer structures on sides of the metal gate, and an etch stop layer on the first semiconductor layer and sidewalls of the spacer structures, a surface of the metal gate a greater distance from the first semiconductor layer than the etch stop layer.

BRIEF DESCRIPTION OF THE DRAWINGS

Example embodiments will be more clearly understood from the following brief description taken in conjunction with the accompanying drawings. FIGS. 1-125 represent non-limiting, example embodiments as described herein.

FIGS. 1-10 are cross-sectional diagrams illustrating methods of manufacturing semiconductor devices according to some example embodiments of the inventive concepts;

Figure 1:
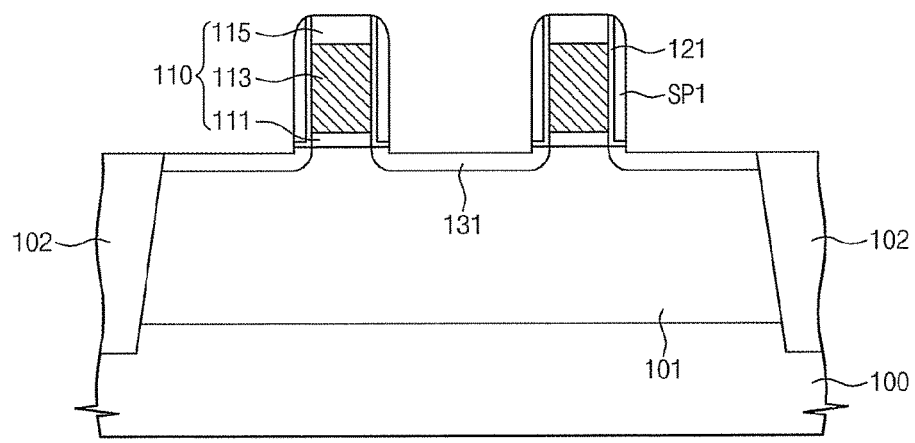

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Semiconductor devices according to example embodiments may include a highly integrated semiconductor devices, for example, a DRAM, SRAM, flash memory, micro electro mechanical systems (MEMS) device, optoelectronic device, and/or processor (e.g., CPU and/or DSP). A semiconductor device may be comprised of only the same type of semiconductor devices or may be a single chip data processing device comprised of different types of semiconductor devices necessary for providing a complete function.

FIGS. 1-10 are cross-sectional diagrams illustrating methods of manufacturing semiconductor devices according to example embodiments of the inventive concepts. Referring to FIG. 1, a semiconductor substrate 100 with an active region defined by a device isolation layer 102 may be prepared. The semiconductor substrate 100 may be, for example, a bulk silicon substrate, a silicon-on-insulator (SOI) substrate, a germanium substrate, a germanium-on-insulator (GOI) substrate, and/or an epitaxial thin film substrate obtained by performing a selective epitaxial growth.

The device isolation layer 102 defining the active region may be formed by forming a trench in the semiconductor substrate 100 and then filling the trench with an insulation material. For example, the device isolation layer 102 may include Boron-Phosphor Silicate Glass (BPSG), High Density Plasma (HDP) oxide, Undoped Silicate Glass (USG), and/or Tonen SilaZene. The semiconductor substrate 100 may include wells 101 doped with n-type and/or p-type impurities to form NMOS and PMOS transistors. For example, the active region may include a p-type well 101 for forming an NMOS transistor and/or an n-type well 101 for forming a PMOS transistor.

Gate stacks 110 may be formed on the active region of the semiconductor substrate 100. A gate stack 110 may be formed by sequentially stacking a gate dielectric layer, a gate conductive layer and a capping layer on the semiconductor substrate 100 and then patterning the gate dielectric layer, the gate conductive layer and the capping layer. A line width of a gate electrode of a semiconductor device may be determined by the patterning of the gate stack 110. For example, the line width of the gate stack 110 may be about 10 nm to about 100 nm. The plurality of gate stacks 110 may be formed spaced apart by a distance from each other on the semiconductor substrate 100.

The gate stack 100 may include a gate dielectric pattern 111, a gate pattern 113 and/or a capping pattern 115. The gate dielectric pattern 111 may include, for example, a silicon oxide layer, a silicon oxynitride layer, and/or a high-k dielectric layer. The gate dielectric pattern 111 may include one or more layers. A high-k dielectric layer may denote insulation materials with a dielectric constant higher than silicon oxide (e.g., tantalum oxide, titanium oxide, hafnium oxide, zirconium oxide, aluminum oxide, yttrium oxide, niobium oxide, cesium oxide, indium oxide, iridium oxide, barium strontium titanate (BST), and/or lead zirconate titanate (PZT)).

The gate pattern 113 may include a material with an etch selectivity with respect to silicon oxide, silicon oxynitride and/or silicon nitride. For example, the gate pattern 113 may include polysilicon doped with n-type or p-type impurities. The gate patterns 113 may include, for example, undoped polysilicon. The capping pattern 115 may be used as an etch mask while the gate pattern 113 is formed, and may include, for example, silicon nitride and/or silicon oxynitride. According to at least one example embodiment, the capping pattern 115 may be a silicon nitride layer deposited at a temperature of about 400° C. to about 600° C.

A first spacer SP1 may be on both sidewalls of each of the gate stacks 110. According to at least one example embodiment, the first spacer SP1 may be formed by conformally depositing a silicon nitride layer on the entire surface of the semiconductor substrate 100 including the gate stacks 110 and performing a blanket anisotropic etch process (e.g., an etch back process). The silicon nitride layer may be deposited by using, for example, a thermal CVD, a plasma enhanced CVD, a remote plasma CVD, a microwave plasma CVD and/or an atomic layer deposition (ALD). According to at least one example embodiment, the first spacer SP1 may be a silicon nitride layer formed by performing a thermal CVD process at a high temperature of about 700° C. to about 800° C. The first spacer SP1 formed thus may have etch selectivity with respect to the capping pattern 115 of the gate stack 110.

A silicon oxide layer may be conformally deposited on the entire surface of the semiconductor substrate 100 including the gate stacks 110 (e.g., prior to the forming of the silicon nitride layer). The silicon oxide layer may be formed by using, for example, a CVD and/or ALD process, and/or by thermally oxidizing the gate patterns 113 and the semiconductor substrate 100. The silicon oxide layer formed thus may cure etch damage occurring in the sidewall of the gate pattern 113 while the gate pattern 113 is patterned, and may function as a buffer layer between the semiconductor substrate 100 and the silicon nitride layer. By, for example, anisotropically etching the silicon oxide layer and the silicon nitride layer, the first spacer SP1 including an L-shaped oxide spacer 121 and the silicon nitride layer may be formed on both sidewalls of each of the gate stacks 110.

According to at least one example embodiment, the first spacer SP1 including silicon nitride may directly contact the sidewalls of the gate stack 110 and a surface of the semiconductor substrate 100. The first spacer SP1 formed thus may solve a short channel effect due to a distance between source and drain electrodes (i.e., a channel length decreases as the line width of the gate electrode in a MOSFET decreases). The first spacer SP1 may increase a distance between lightly doped impurity regions 131. Lightly doped impurity regions 131 doped with n-type or p-type impurities may be formed at both sides of the gate stacks 110.

The light doped impurity regions 131 may be formed by implanting n-type or p-type impurity ions into the semiconductor substrate 100 by using the gate stacks 110 and the first spacers SP1 as ion implantation masks. In this ion implantation, the p-type impurity may be boron (B) and the n-type impurity may be arsenic (As), for example. The lightly doped impurity region 131 may be self-aligned with the first spacer SP1. The lightly doped impurity region 131 may extend under the first spacer SP1 due to impurity diffusion. According to at least one example embodiment, the lightly doped impurity region 131 may be formed by using the gate stack 110 as an ion implantation mask prior to the forming of the first spacer SP1.

A channel impurity region (not illustrated) may be formed by performing a halo ion implantation process (e.g., after the lightly doped impurity region 131 is formed). The channel impurity region may be formed by implanting impurity ions of an opposite conductive type to the lightly doped impurity region 131. The channel impurity region may prevent a punch-through phenomenon by increasing the concentration of the active region under the gate stack 110.

Figure 2:
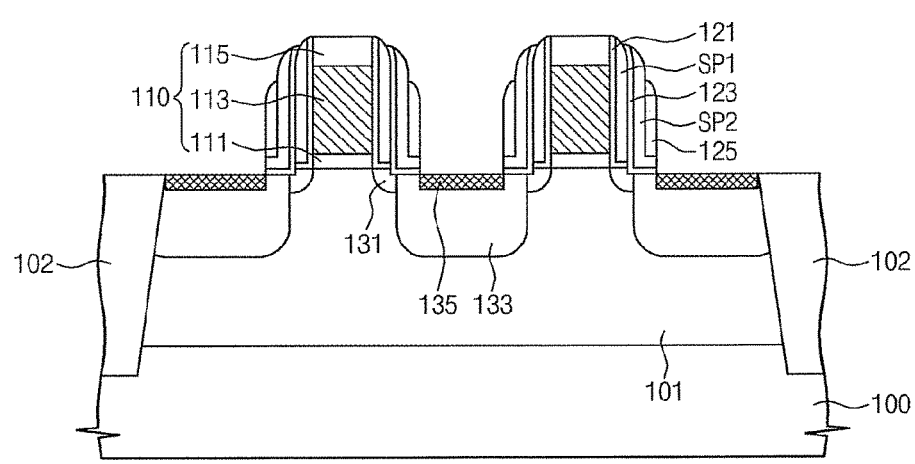

Referring to FIG. 2, a second spacer SP2 covering sidewalls of the first spacer SP1 at both sides of the gate stacks 110 may be formed. According to at least one example embodiment, the second spacer SP2 may be formed by forming the lightly doped impurity region 131, conformally depositing a silicon nitride layer on an entire surface of the semiconductor substrate 100 and then performing a blanket anisotropic etch process (e.g., an etch back process). The silicon nitride layer may be deposited by, for example, a thermal CVD, a plasma enhanced CVD, a remote plasma CVD, a microwave plasma CVD and/or an atomic layer deposition (ALD). According to at least one example embodiment, the silicon nitride layer of the second spacer SP2 may be formed by using an atomic layer deposition at a temperature of about 400° C. to about 600° C. The second spacer SP2 may have etch selectivity with respect to the first spacer SP1.

A silicon oxide layer may be conformally formed on the semiconductor substrate 100 (e.g., before the forming of the silicon nitride layer for forming the second spacer SP2). The silicon oxide layer may be formed by using, for example, CVD and/or ALD. The silicon oxide layer may cover the lightly doped impurity region 131 exposed to the atmosphere and may function as a buffer layer between the semiconductor substrate 100 and the silicon nitride layer. The silicon oxide layer and the silicon nitride layer may be etched back to form the second spacer SP2 constituting an L-shaped oxide spacer 123 covering the first spacer SP1 and the silicon nitride layer.

A silicon oxide layer may be formed on the silicon nitride layer for forming the second spacer SP2 (e.g., before performing the anisotropic etch process). The second spacer SP2 may be formed by sequentially forming a silicon oxide layer, a silicon nitride layer and a silicon oxide layer and anisotropically etching the silicon oxide layer, silicon nitride layer and silicon oxide layer. The second spacer SP2 including the silicon nitride layer may be L-shaped, and an upper oxide spacer 125 may be formed on the L-shaped second spacer SP2. The forming of the second spacer SP2 may increase the distance between highly doped impurity regions 133. According to other example embodiments, the second spacer SP2 including the silicon nitride layer may directly contact the sidewall of the first spacer SP1 and the surface of the semiconductor substrate 100.

Heavily doped impurity regions 133 doped with an N-type or P-type impurity may be formed at both sides of the gate stacks 110. For example, boron (B) may be used as a P-type impurity and arsenic (As) may be used as an N-type impurity. When the heavily doped impurity regions 133 are formed, a concentration of the impurity and the ion implantation energy may be greater than the concentration of the impurity and the ion implantation energy for forming the lightly doped impurity region 131. A heat treatment process, for example, a rapid thermal process (RTP) and/or laser annealing (LSA) may be performed (e.g., after the ion implantation process).

After the heavily doped impurity regions 133 are formed, a source/drain including the lightly doped impurity region 131 and the heavily doped impurity region 133 may be formed in the active region between the gate stacks 110. A plurality of gate structures may be formed on the semiconductor substrate 100. The gate structure may include the gate stack 110 and the first and second spacers SP1 and SP2 at both sides of the gate stack 110. MOSFETs may be on the semiconductor substrate.

When MOSFETs are formed, the line width of the gate electrode may decrease (e.g., may be reduced to increase integration density), whereby the distance between the gate stacks 110 may decrease. Because the first and second spacers SP1 and SP2 for securing the distance between the source and drain electrodes may be formed on the sidewalls of each of the gate stacks 110, the forming of the first and second spacers SP1 and SP2 may decrease a region of the semiconductor substrate 100 exposed between the gate stacks 110. The forming of the first and second spacers SP1 and SP2 may decrease the spacing between the gate structures. In a subsequent process of filling the gate structures with an insulating material, it may be difficult to completely fill a gap region between the gate structures with an insulating material. According to at least one example embodiment, before filling the gap region between the gate structures with an insulating material, forming of a silicide layer and forming of an etch stop pattern may be performed, as illustrated in FIGS. 2 and 3.

Referring to FIG. 2, a silicide layer 135 may be formed on the heavily doped impurity regions 133. The forming of the silicide layer 135 may include forming a metal layer on the heavily doped impurity regions 133, performing a heat treatment to react the metal layer with silicon, and removing metal which is not reacted with the silicon. For example, a metal layer may be conformally deposited on the semiconductor substrate 100 including the gate structures, and a heat treatment may be performed. The metal layer may include, for example, a refractory metal, for example, cobalt (Co), titanium (Ti), nickel (Ni) and/or tungsten (W). The metal layer may include, for example, a metal alloy with at least two of hafnium (Hf), tungsten (W), cobalt (Co), platinum (Pt), molybdenum (Mo), palladium (Pd), vanadium (V) and/or niobium (Nb).

A metal layer may be formed and a heat treatment may be performed. Some of the silicon of the heavily doped impurity region 133 may be consumed and the silicide layer 135 may be formed at the portion where silicon is consumed. The heat treatment may be performed at a temperature of about 250° C. to about 800° C. An RTP apparatus and/or a furnace may be used. The silicide layer 135 formed on the heavily doped impurity region 133 may be, for example, a cobalt silicide layer, a titanium silicide layer, a nickel silicide layer and/or a tungsten silicide layer. After the heat treatment for forming the silicide layer 135, a wet etch process may be performed to remove metal which is not reacted with the silicon.

Figure 3:
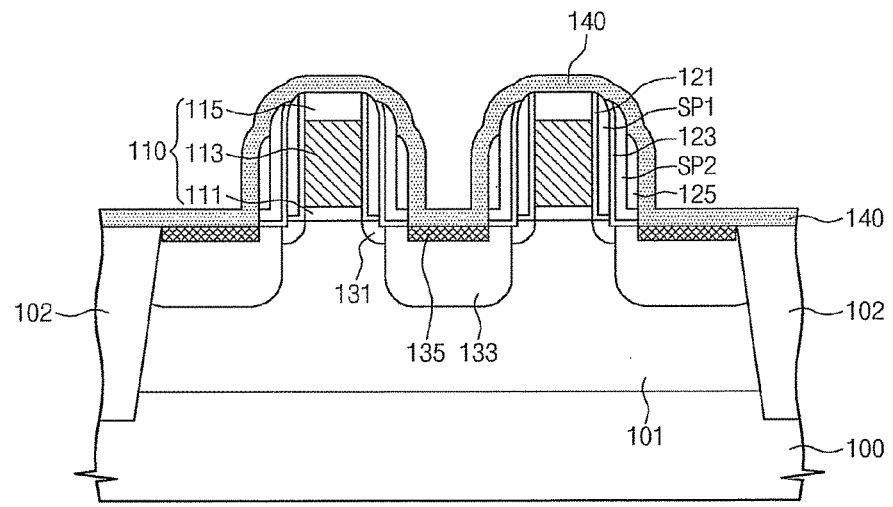

Referring to FIG. 3, an etch stop layer 140 may be, for example, conformally deposited on the semiconductor substrate 100 formed with the gate structures. According to at least one example embodiment, the etch stop layer 140 may cover a capping pattern 115 of the gate stack 110, the spacer structure SP and the silicide layer 135. As the etch stop layer is conformally formed on the semiconductor substrate 100, the etch stop layer 140 may define a gap region between the gate structures. The etch stop layer 140 may be formed of a material with etch selectivity to insulation layers. According to at least one example embodiment, the etch stop layer 140 may include a material with etch selectivity to the first spacer SP1. The etch stop layer 140 may have etch selectivity with respect to the first and second spacers SP1 and SP2. For example, the etch stop layer 140 may be formed of a silicon nitride layer and/or silicon oxynitride layer.

The etch stop layer 140 may include a silicon nitride layer. The etch stop layer 140 may be deposited using, for example, thermal CVD, plasma enhanced CVD, remote plasma CVD, microwave plasma CVD and/or atomic layer deposition. According to at least one embodiment, the silicon nitride layer of the etch stop layer 140 may be formed by using a plasma enhanced CVD at a temperature of about 250° C. to about 500° C. The etch stop layer 140 may have etch selectivity with respect to the first and second spacers SP1 and SP2. The etch stop layer 140 may be used as an etch stop layer and may be used as a stress layer for applying stress to the channel region of a transistor.

The capping pattern 115 of the gate stack 110, the first and second spacers SP1 and SP2, and the etch stop layer 140 may be formed of or include a silicon nitride layer. The capping pattern 115 of the gate stack 110, the first and second spacers SP1 and SP2, and the etch stop layer 140 may have etch selectivity according to a hydrogen content of the silicon nitride layers. The hydrogen content of a silicon nitride layer may vary depending on, for example, a process temperature for depositing the silicon nitride layer. When a deposition process is used for forming a silicon nitride layer, the silicon nitride layer may be deposited by using a silicon source gas and a nitrogen source gas. The silicon source gas may be, for example, $SIH_4$, $Si_2H_6$, $SiH_3Cl$ and/or $SiH_2Cl_2$. The nitrogen source gas may be, for example, $NH_3$ and/or $N_2$. When a silicon nitride layer is formed by reacting these source gases, the silicon nitride layer may include hydrogen. The hydrogen content contained in the silicon nitride layer may decrease as the process temperature for forming the silicon nitride layer is elevated.

According to at least one example embodiment, the first spacer SP1 may include about 2 atomic % to about 10 atomic % hydrogen based on a formation temperature of about 700° C. to about 800° C. using thermal CVD. The second spacer SP2 may include a greater amount of hydrogen than the first spacer SP1 when the second spacer SP2 is formed at a temperature of about 400° C. to about 600° C., which may be lower than the deposition temperature of the first spacer SP1, by using an ALD. For example, the hydrogen content contained in the silicon nitride layer of the second spacer SP2 may be about 10 atomic % to about 15 atomic %. The etch stop layer 140 may include a greater amount of hydrogen than the second spacer SP2 when the etch stop layer 140 is formed at a temperature of about 250° C. to about 500° C., which is lower than the deposition temperature of the second spacer SP2, by using a PE-CVD. For example, the hydrogen content contained in the etch stop layer 140 may be about 10 atomic % to about 20 atomic %.

The first and second spacers SP1 and SP2, and the etch stop layer 140, which may be formed of silicon nitride layers, may have different etch rates from one another in a process of removing the silicon nitride layer when the first and second spacers SP1 and SP2, and the etch stop layer 140 are formed at different process temperatures. According to other example embodiments, the etch stop layer 140 may be a silicon nitride layer formed by using an ALD at a temperature of about 400° C. to about 600° C., which may be similar to the deposition temperature of the second spacer SP2. According to still other example embodiments, the second spacer SP2 may be formed at a temperature of about 700° C. to about 800° C. by using a thermal CVD, similarly to the first spacer SP1.

Figure 4:
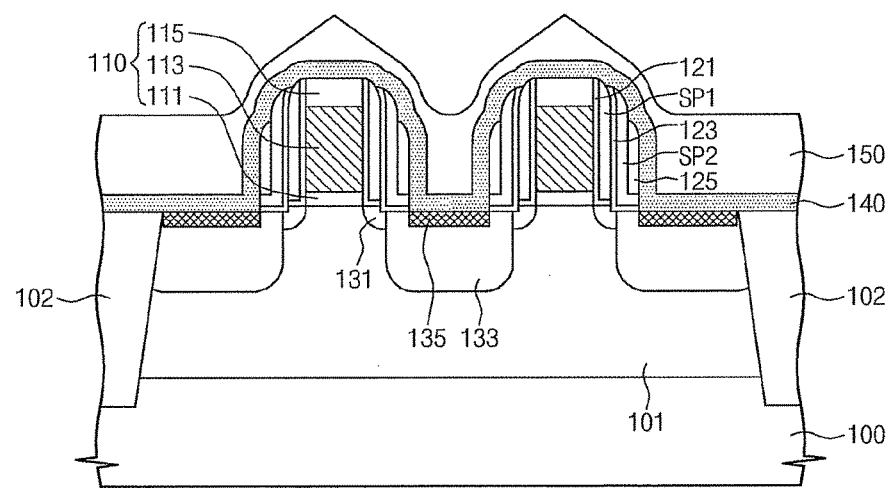
Figure 5:
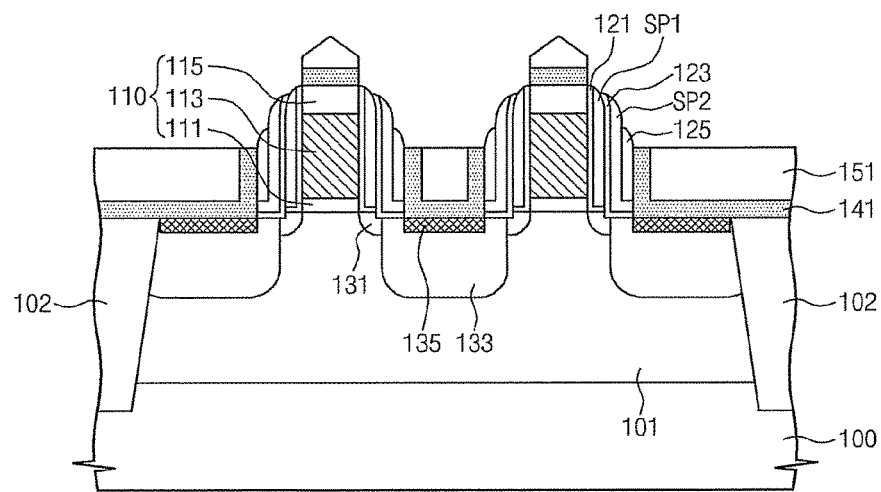

Referring to FIGS. 4 and 5, an etch stop pattern 141 may be selectively formed on the heavily doped impurity region 133. The etch stop pattern 141 may be formed by locally removing the etch stop layer 140 from the upper surface of the gate structure. The forming of the etch stop pattern 141 may include forming a sacrificial insulation layer 150 on the etch stop layer 140, locally forming a sacrificial insulation pattern 151 between the gate structures, and selectively removing the etch stop layer 140 formed on the gate structure. Referring to FIG. 4, the sacrificial insulation layer 150 on the etch stop layer 140 may include, for example, a high density plasma oxide (HDP), tetraethylorthosilicate (TEOS), plasma enhanced tetraethylorthosilicate (PE-TEOS), phosphosilicate glass (PSG), borosilicate glass (BSG), borophosphosilicate glass (BPSG), polymer and/or polysilicon.

According to at least one example embodiment, the sacrificial insulation layer 150 may be a layer formed by using a high density plasma-chemical vapor deposition (HDP-CVD). HDP-CVD is a technique which combines CVD and sputtering etch processes. HDP-CVD may deposit a silicon oxide layer by supplying a deposition gas for depositing a silicon oxide layer and an etch gas for etching an insulation layer together. The deposition gas and the etch gas for forming the silicon oxide layer may be ionized by plasma, and the deposition gas and etch gas which may be ionized may be accelerated toward the surface of the semiconductor substrate 100. The accelerated deposition gas ions may form a silicon oxide layer and the accelerated etch gas ions may etch the deposited silicon oxide layer. While the sacrificial insulation layer 150 is formed, the deposition process and the etch process may be performed at the same time. Because the deposition rate may be faster than the etch rate, the sacrificial insulation layer 150 may be formed on the etch stop layer 140.

When the sacrificial insulation layer 150 is formed by HDP-CVD, because the etch rate in an upper portion of the gap region between the gate structures is faster than the deposition rate, the sacrificial insulation layer 150 may be thinner in the upper portion of the gap region than in a lower portion of the gap region. The sacrificial insulation layer 150 formed by an HDP-CVD may have a conical profile, pointed at the top, on the gate structures, as illustrated in FIG. 4. The sacrificial insulation layer 150 with a difference in deposition thickness may be formed on the etch stop layer 140 by using HDP-CVD.

The sacrificial insulation layer 150 may be anisotropically etched to form a sacrificial insulation pattern 151 on the etch stop layer 140 between the gate structures. The sacrificial insulation pattern 151 may be formed by, for example, blanket-etching the sacrificial insulation layer 150 using an etch-back process. Because the sacrificial insulation layer 150 is thinly deposited at the upper portion of the gap region between the gate structures by using HDP-CVD, some of the etch stop layer 140 formed on the gate structure by the etch-back process may be exposed. The thickness of the sacrificial insulation layer 150 on the semiconductor substrate 100 and the gate structures may decrease to form the sacrificial insulation pattern 151. The sacrificial insulation patterns 151 may be locally formed between the gate structures, as illustrated in FIG. 5.

An upper surface of the sacrificial insulation pattern 151 may be leveled lower than an upper surface of the gate pattern 113. The sacrificial insulation pattern 151 may be left on the gate structure. The sacrificial insulation patterns formed thus may prevent the etch stop layer 140 on the heavily doped impurity region 133 from being removed while the etch stop layer 140 is etched. The etch stop layer 140 may be anisotropically and/or isotropically etched to form an etch stop pattern 141 by using the sacrificial insulation pattern 151 as a mask. As the etch stop pattern 141 is formed, an extended gap region may be formed between the gate structures.

According to at least one example embodiment, because a hydrogen content of the etch stop layer 140 may be different from the hydrogen content of the first and second spacers SP1 and SP2, the etch stop layer 140 may have an etch selectivity with respect to the first and second spacers SP1 and SP2, and the etch stop layer 140 may be selectively etched. The etch stop layer 140 exposed by the sacrificial insulation pattern 151 may be selectively etched so that upper portions of the first and second spacers SP1 and SP2 are exposed by the etch stop pattern 141. Because the sacrificial insulation pattern 151 may be used as an etch mask, the etch stop pattern 141 may be left on the heavily doped impurity region 133 (e.g., silicide layer 135). In a case where the sacrificial insulation pattern 151 is left on the gate structure, some of the etch stop layer 140 may be left on the gate structure when the etch stop pattern 141 is formed (e.g., on the top of the gate structure).

The etch stop pattern 141 may include a bottom portion covering an upper surface of the heavily doped impurity region 133, and a sidewall portion extending from the bottom portion to partially cover the sidewall of the second spacer SP2. An upper surface of the sidewall portion may be positioned lower than an upper surface of the gate pattern 113. For example, the distance from the upper surface of the bottom portion of the etch stop pattern 141 to the upper surface of the sidewall portion may be in a range of about 0% to about 80% of a distance from the upper surface of the semiconductor substrate 100 to the upper surface of the metal gate. The sidewall portion may have an angle less than or equal to 90 degrees with respect to the semiconductor substrate 100 according to shapes of the first and second spacers SP1 and SP2. As the etch stop pattern 141 is formed as above, an upper width between the gate structures may increase. A gap fill margin of a gap fill insulation layer 153 may be secured.

Figure 6:
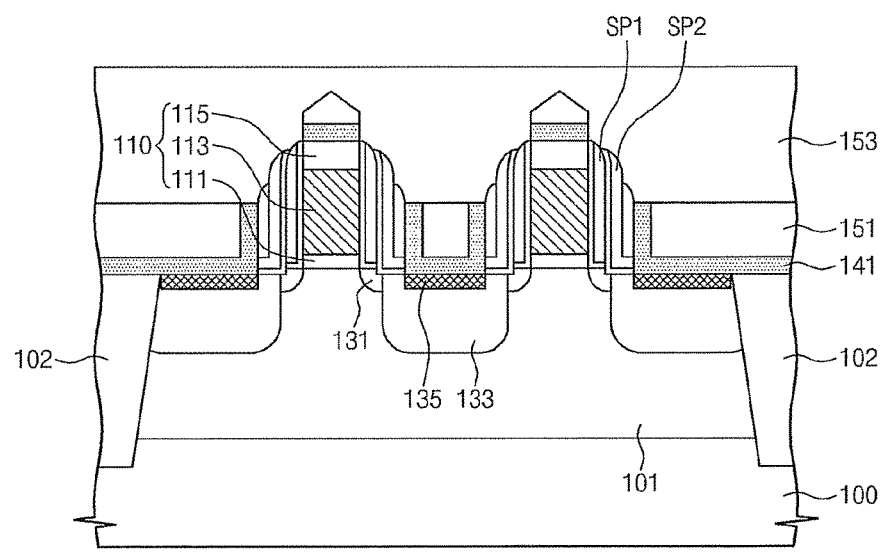

Referring to FIG. 6, a gap fill insulation layer 153 filling the extended gap region between the gate structures may be formed. The gap fill insulation layer 153 may be formed of an insulation material with superior gap fill characteristic. For example, the gap fill insulation layer 153 may be formed of HDP oxide, TEOS, PE-TEOS, $O_3$-tetra ethyl ortho silicate ($O_3$-TEOS), undoped silicate glass (USG), PSG, BSG, BPSG, fluoride silicate glass (FSG), spin on glass (SOG), tonen silazene (TOSZ), or combinations thereof. The gap fill insulation layer 153 may be formed by using a deposition technique capable of providing superior step coverage. For example, the gap fill insulation layer 153 may be formed by using a CVD, spin coating and/or the like. The gap fill insulation layer 153 may be deposited to a sufficient thickness on the extended gap region and the gate structures.

According to at least one example embodiment, the gap fill insulation layer 153 may be formed of the same material as the sacrificial insulation pattern 151. In this case, for example, the gap fill insulation layer 153 may cover upper surfaces of the sacrificial insulation pattern 151 and the etch stop pattern 151. The gap fill insulation layer 153 may cover the upper surface of the sidewall portion of the etch stop pattern 141. According to other example embodiments, the gap fill insulation layer 153 may be formed on the etch stop pattern 141 after the sacrificial insulation pattern 151 is removed.

A metal gate replacing process of replacing the gate pattern 113 with a metallic material may be performed. For example, in the case the gate pattern 113 includes an impurity doped polysilicon, when the line width of the gate pattern 113 is less than or equal to 100 nm, resistance may increase. In a process of forming impurity regions and the silicide layer 135, the gate pattern 113 may be damaged due to a high temperature heat treatment process. In the case the gate pattern 113 is formed of a metallic material, it may be difficult to pattern the metallic material in a fine line width less than or equal to 100 nm, and the gate pattern 113 may be damaged due to a high temperature heat treatment process.

According to example embodiments of the inventive concepts, after the processes for forming the impurity regions 31, 133 and the silicide layer 135, which may be followed by a high temperature heat treatment process, are performed, the gate pattern 113 formed of polysilicon may be replaced by a metallic material. A metal gate electrode with a fine line width less than or equal to 100 nm, and superior and/or improved characteristic may be formed. A metal gate replacing process may include exposing an upper surface of the gate pattern 113 as illustrated in FIG. 7, selectively removing the gate pattern 113 to form a trench 156 between the first spacers SP1 as illustrated in FIG. 8, and forming a metal gate electrode in the trench 156 as illustrated in FIG. 9.

Figure 7:
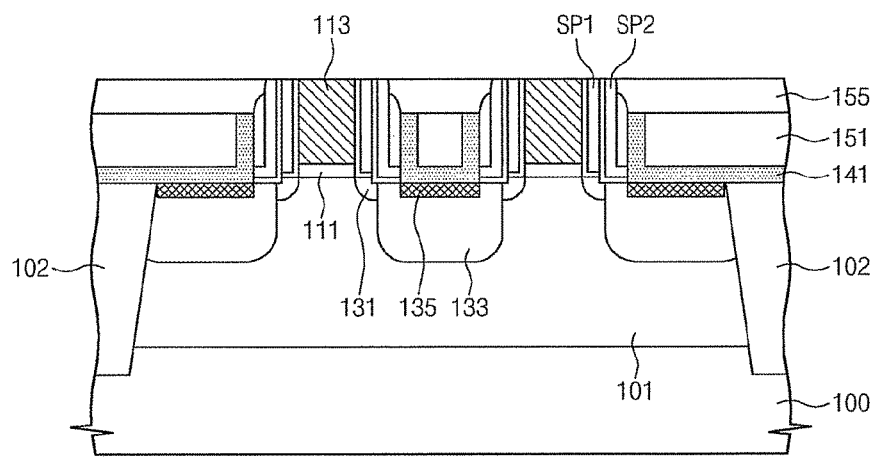

Referring to FIG. 7, a process of planarizing the gap fill insulation layer 153 that forms a gap fill insulation pattern 155 may be performed until the gate pattern 113 is exposed. For the planarizing of the gap fill insulation layer 153, an etch back process and/or chemical mechanical polishing (CMP) process may be used, for example. According to at least one example embodiment, the gap fill insulation layer 153 may be planarized by performing a CMP process until the upper surface of the capping pattern 115 is exposed. An etch back process may be performed to remove the capping pattern 115, so that the upper surface of the gate pattern 113 may be exposed. The gap fill insulation layer 153 may be planarized to the upper surface of the gate pattern 113 by using a CMP process. Some portions of the first and second spacers SP1 and SP2 may be removed together.

As illustrated in FIG. 3, in a case where the etch stop layer 140 covers the first and second spacers SP1 and SP2 and the capping pattern 115, when the gap fill insulation layer 153 is planarized for the metal gate replacing process, the etch stop layer 140 may be exposed together with the upper surface of the capping pattern 115. In this case, while the capping pattern 115 including silicon nitride is removed, some portion of the etch stop layer 140 may be removed together with the capping pattern 115. A dent may be generated at an upper surface of the planarized gap fill insulation layer 153. The dent may cause a process failure when the gate pattern 113 is replaced by a metal pattern in a subsequent process. According to example embodiments of the inventive concepts, when the gap fill insulation layer 153 is planarized and the capping pattern 115 is removed, the etch stop pattern 141 formed of silicon nitride may not be exposed by the gap fill insulation layer 153. A dent may not be generated at the upper surface of the gap fill insulation pattern 155 when the capping pattern 115 is removed.

Figure 8:
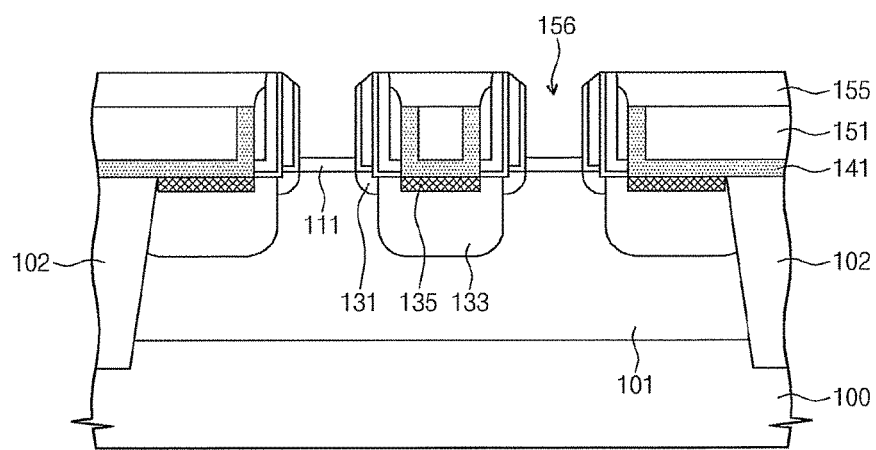
Figure 9:
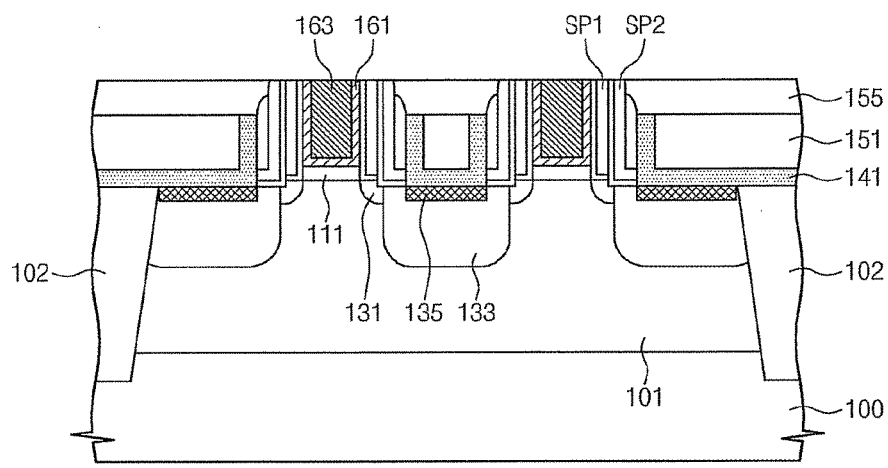

Referring to FIG. 8, the gate pattern 113 may be removed to form a trench 156 between one pair of gate structures. The removing of the gate pattern 113 may be performed by a combination of a dry etch and a wet etch. Some of the gate pattern 113 exposed by the gap fill insulation layer 153 may be dry-etched. While some of the gate pattern 113 is dry-etched, an upper portion of the first spacer SP1 may be also dry-etched. An inclination surface inclined inwardly may be formed at an upper portion of the first spacer SP1. An upper width of the trench 156 may be greater than a lower width of the trench 156.

The gate patterns 113 may be wet-etched by using an etchant with etch selectivity to an interlayer dielectric and the first spacers SP1 to form a trench 156 between one pair of first spacers SP1. For example, in the case the gate pattern 113 is formed of polysilicon, the gate pattern 113 may be wet-etched by using an etchant in which nitric acid, acetic acid and hydrofluoric acid are mixed. Before the wet etch process for etching the gate pattern 113 is performed, a process of removing a native oxide layer formed on a surface of the gate pattern 113 may be performed.

Figure 19:
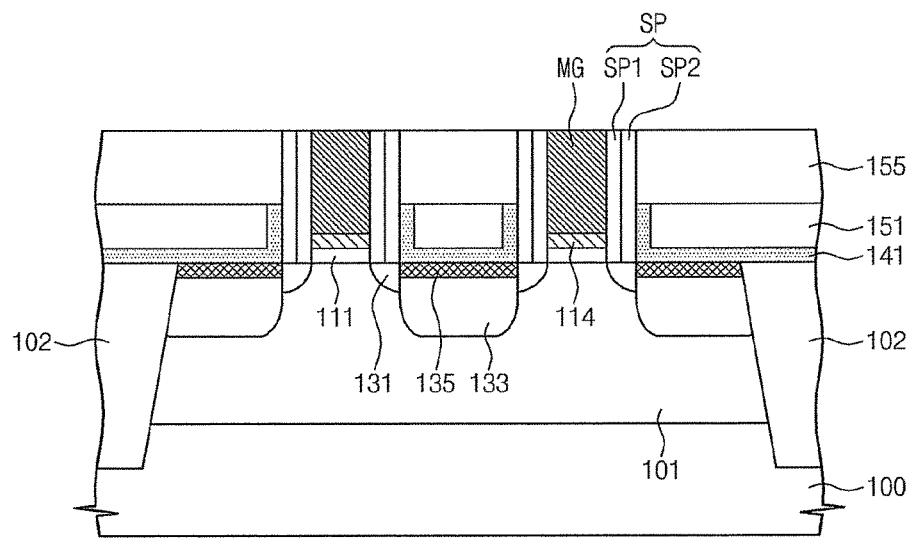
FIGS. 19-25 are cross-sectional diagrams illustrating semiconductor devices according to various example embodiments of the inventive concepts.

The trench 156 may expose inner walls of the first spacers SP1 and an upper surface of the gate insulation pattern 111. According to example embodiments, some portion of the gate pattern 113 may be left on the gate insulation pattern 111 as illustrated in FIG. 19. In this case, the etch process for removing the gate pattern 113 may prevent the gate insulation pattern 111 from being damaged. As illustrated in FIG. 9, a metal gate electrode 163 may be formed in the trench 156.

The forming of the metal gate electrode 163 may include depositing a metal layer filling the trench 156 on the gap fill insulation pattern 155, and planarizing the metal layer until the gap fill insulation pattern 155 is exposed. The metal layer may be formed by using, for example, CVD, physical vapor deposition (PVD) and/or ALD. For example, the metal layer may include tungsten, copper, hafnium, zirconium, titanium, tantalum, aluminum, ruthenium, palladium, platinum, cobalt, nickel and/or conductive metal nitrides, or combinations thereof. The metal layer may be planarized by using an etch process and/or a CMP process until the gap fill insulation pattern 155 is exposed. The metal gate electrode 163 may be formed in the trench 156. Because the gate electrode of the MOSFET is formed of a metallic material with low resistivity, operational characteristics of the semiconductor device may be enhanced.

According to example embodiments, a barrier metal layer 161 may be conformally formed in the trench 156 (e.g., before the metal layer is deposited). For example, the barrier metal layer 161 may include titanium nitride, tantalum nitride, tungsten nitride, hafnium nitride, zirconium nitride, or combinations thereof. The barrier metal layer 161 may prevent and/or reduce a metallic material from being diffused into the gate insulation pattern 111 and the semiconductor substrate 100.

Figure 10:
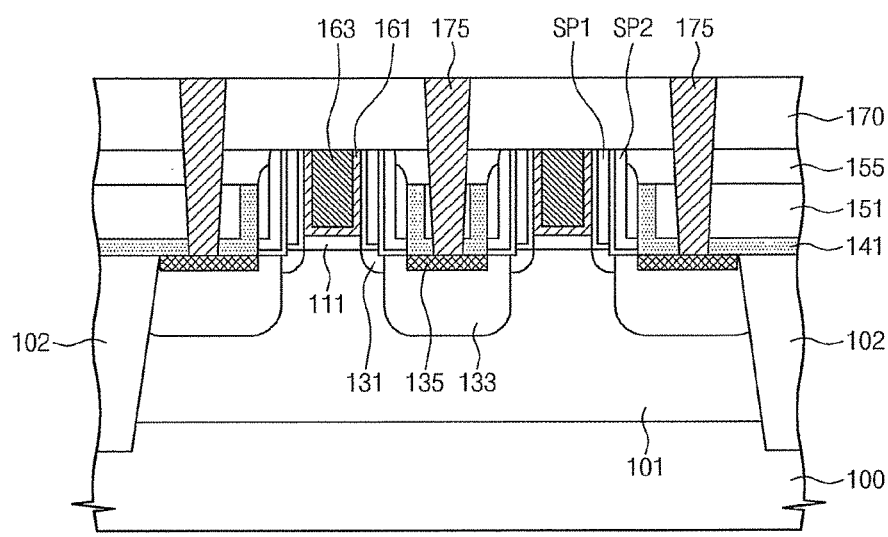

Referring to FIG. 10, contact plugs 175 connected to the silicide layer 135 may be formed. An interlayer dielectric 170 may be formed on the gap fill insulation pattern 155 (e.g., after the metal gate electrodes 163 are formed). For example, the interlayer dielectric may include an HDP oxide, TEOS, PE-TEOS, $O_3$-TEOS, USG, PSG, BSG, BPSG, FSG, SOG, TOSZ, or combinations thereof.

The interlayer dielectric 170, the gap fill insulation pattern 155, the sacrificial insulation pattern 151 and the etch stop pattern 141 may be patterned to form contact holes exposing the silicide layer 135. The forming of the contact holes may include, for example, forming a mask pattern on the interlayer dielectric 170, and anisotropically etching the interlayer dielectric 170, the gap fill insulation layer 153 and the sacrificial insulation pattern 151 by using the mask pattern. When the contact holes are formed in the interlayer dielectric 170, the gap fill insulation pattern 155 and the sacrificial insulation pattern 151 may be etched by using an anisotropic etch process, and an upper surface of the etch stop layer 141 may be exposed. The contact hole exposing the silicide layer 135 may be formed by over-etching some of the etch stop pattern 141 exposed by the contact hole.

A conductive material may be filled into the contact holes to form contact plugs 175. The contact plugs 175 may be formed of a metallic material with low resistivity. For example, the contact plug 175 may be formed of cobalt, titanium, nickel, tungsten, molybdenum, and/or a metal nitride (e.g., titanium nitride, tantalum nitride, tungsten nitride and/or titanium aluminum nitride). A barrier metal layer (not shown) for preventing a metal element from being diffused may be formed (e.g., before the contact plug 175 is formed). The barrier metal layer may conformally cover an inner wall of the trench. The barrier metal layer may be formed conformally on inner walls of the gate insulation pattern 111 and the first spacer SP1. For example, the barrier metal layer may include a conductive metal nitride (e.g., tungsten nitride, titanium nitride and/or tantalum nitride).

The contact plug 175 may penetrate a portion of the etch stop pattern 141 and may be connected to the silicide layer 135. While according to at least one example embodiment the contact plugs 175 may be connected to the silicide layers 135, respectively, the connection of the contact plugs 175 may be changed selectively.

Figure 11:
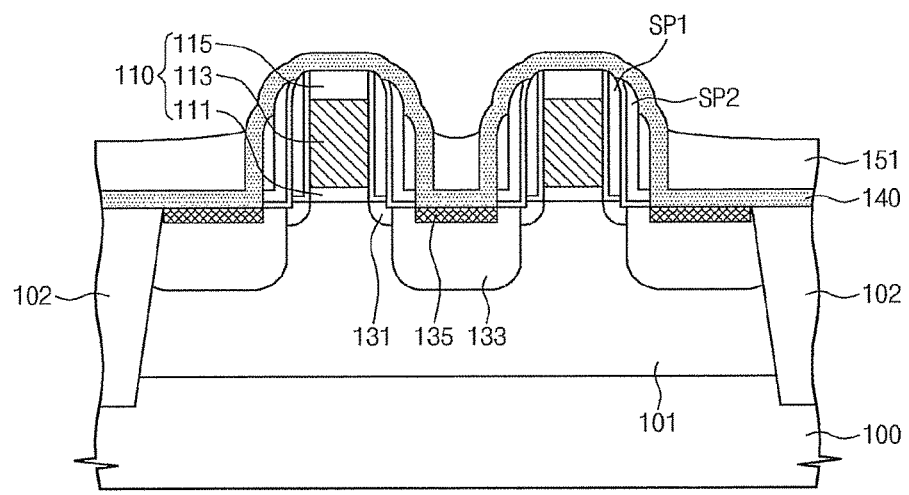
FIGS. 11-14 are cross-sectional diagrams illustrating methods of manufacturing semiconductor devices according to other example embodiments of the inventive concepts.

FIGS. 11-14 are cross-sectional diagrams illustrating methods of manufacturing semiconductor devices according to other example embodiments of the inventive concepts. According to the example embodiments of FIGS. 11-14 and the example embodiments of FIGS. 1-10, like reference numerals may denote like elements, and thus their description may be omitted. Gate stacks 110, spacer structures SP and an etch stop layer 140 may be formed on a semiconductor substrate 100, as described with reference to FIGS. 1-3. Referring to FIG. 3 and FIG. 11, a sacrificial insulation pattern 151 exposing an upper portion of an etch stop layer 140 may be formed.

The forming of the sacrificial insulation pattern 151 may include, for example, forming a sacrificial insulation layer 150 covering the gate structures and then recessing an upper surface of the sacrificial insulation layer 150 to locally leave the sacrificial insulation pattern 151 between the gate structures. The sacrificial insulation layer 150 may be formed on the etch stop layer 140 to a sufficient thickness such that a gap region between the gate structures may be filled. The sacrificial insulation layer 150 may cover an entire surface of the etch stop layer 140. The sacrificial insulation layer 150 may include, for example, a HDP oxide, TEOS, PE-TEOS, $O_3$-TEOS, USG, PSG, BSG, BPSG, FSG, SOG, TOSZ, or combinations thereof.

An upper surface of the sacrificial insulation layer 150 may be recessed to form a sacrificial insulation pattern 151 on the etch stop layer 140 covering the semiconductor substrate 100. The sacrificial insulation pattern 151 may be formed by, for example, wet-etching the sacrificial insulation layer 150 such that the etch stop layer 140 covering an upper portion of the gate stack 110 is exposed. By the wet etching process, the upper surface of the sacrificial insulation layer 150 may be recessed to a point lower than an upper surface of the gate pattern 113. The etch stop layer 140 covering upper portions of the gate stack 110 and the spacer structure SP may be exposed. The sacrificial insulation pattern 151 may be locally formed between the gate stacks 110.

As described with reference to FIG. 5, the etch stop layer 140 exposed by the sacrificial insulation pattern 151 may be selectively removed to form an etch stop pattern 141. The etch stop pattern 141 may be selectively formed on heavily doped impurity regions 133 (e.g., silicide layer 135). An extended gap region may be formed between the gate structures.

Figure 12:
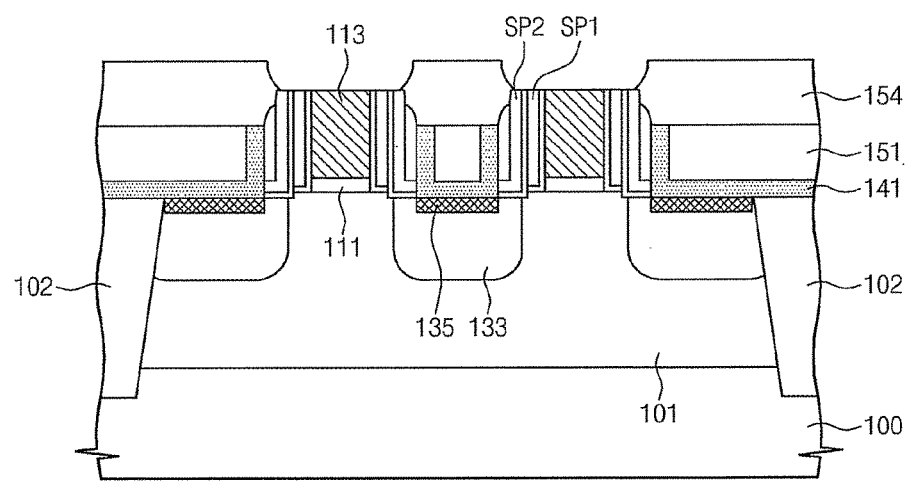

Referring to FIG. 12, a gap fill insulation layer 153 covering the gate structures and the etch stop patterns 141 may be formed. As described with reference to FIG. 6, the gap fill insulation layer 153 may be formed of the same material as the sacrificial insulation pattern 151. The gap fill insulation layer 153 may be formed to a sufficient thickness on the extended gap region between the gate structures and on the gate structures. The gap fill insulation layer 153 may cover the upper surfaces of the sacrificial insulation pattern 151 and the etch stop pattern 141. The etch stop pattern 141 may be covered by the gap fill insulation layer 153.

Figure 13:
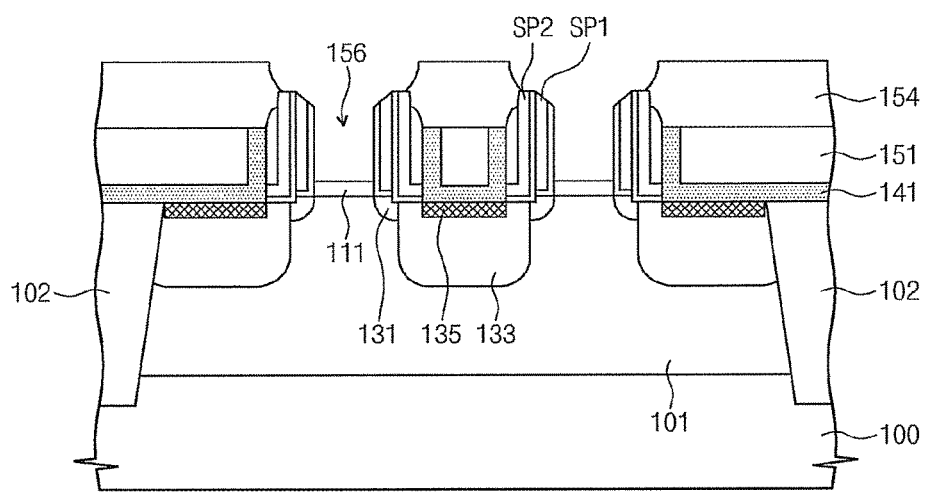
Figure 14:
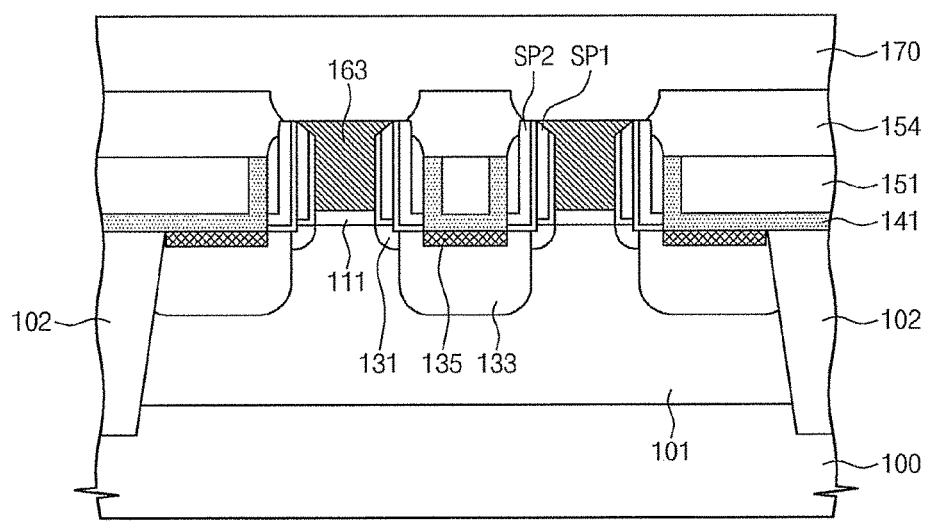

Referring to FIGS. 12-14, a metal gate replacing process may be performed. The metal gate replacing process may include exposing an upper surface of the gate pattern 113 as illustrated in FIG. 12, selectively removing the gate pattern 113 to form a trench between the first spacers SP1 as illustrated in FIG. 13, and forming a metal gate electrode in the trench as illustrated in FIG. 14.

Referring to FIG. 12, the gap fill insulation layer 153 may be planarized by performing an etch back process or a CMP process until an upper surface of the capping pattern 115 is exposed. Gap fill insulation patterns 154 may be formed. An upper surface of the gate pattern 113 may be exposed by wet-etching the capping pattern 115 using, for example, an etchant containing phosphoric acid. The upper surface of the gate pattern 113 may be lower than the upper surface of the gap fill insulation pattern 154, and the etch stop pattern 141 may not be exposed by the gap fill insulation layer 154. Portions of the first and second spacers SP1 and SP2 adjacent to the capping pattern 115 may be removed together while removing the capping pattern 115 (e.g., capping pattern 115 of silicon nitride).

Referring to FIG. 13, an upper portion of the gate pattern 113 may be removed by performing a dry etch process. An upper width of a trench 156 may be greater than a lower width of the trench 156 by etching upper portions of the first and second spacers SP1 and SP2. The trench 156 may be formed between the pair of first spacers SP1 by wet-etching the gate patterns 113 using an etchant with etch selectivity to the interlayer dielectric and the first spacer SP1. Referring to FIG. 14, a metal gate electrode 163 may be formed in the trench 156. The forming of the metal gate electrode 163, as described with reference to FIG. 9, may include depositing a metal layer filling the trench 156 on the gap fill insulation pattern 154, and etching the metal layer to locally form the metal gate electrode 163 in the trench 156.

Figure 15:
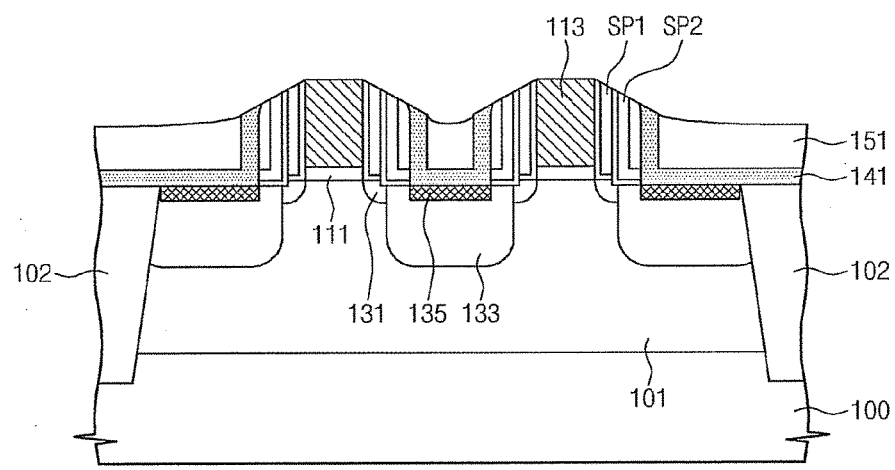
FIGS. 15-17 are cross-sectional diagrams illustrating methods of manufacturing semiconductor devices according to still other example embodiments of the inventive concepts.
Figure 16:
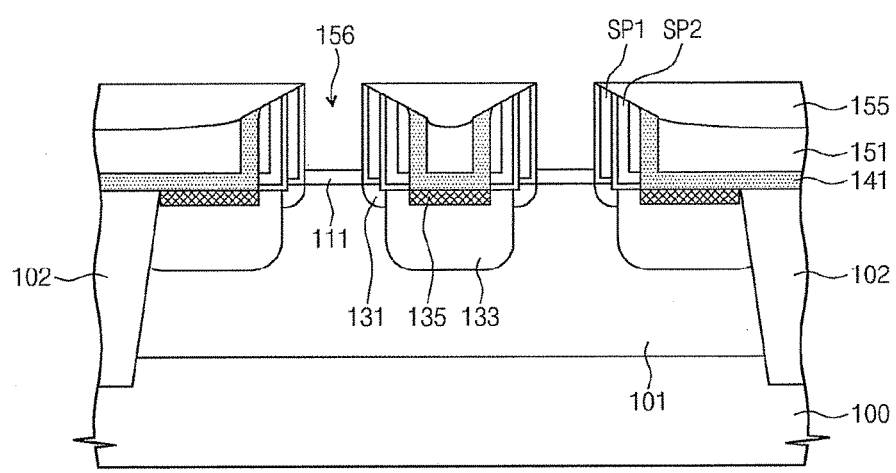
Figure 17:
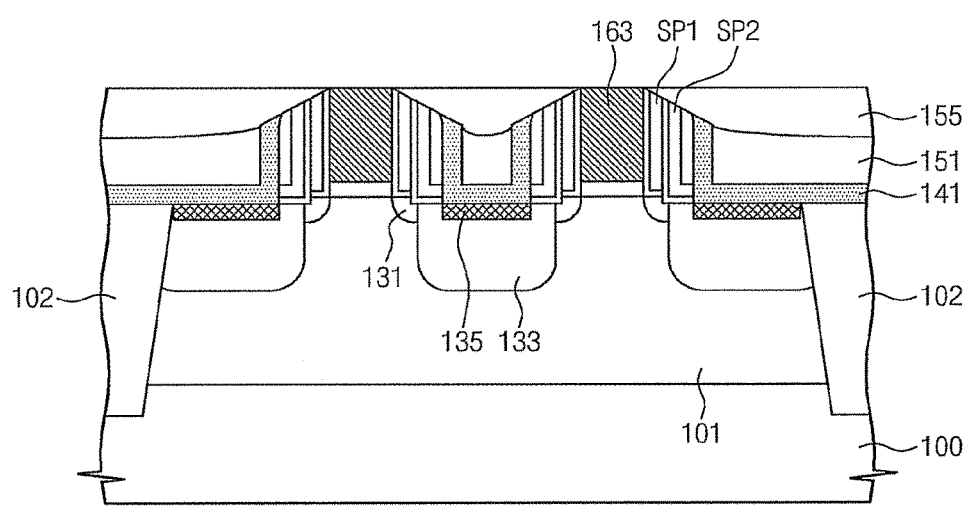

FIGS. 15-17 are cross-sectional diagrams illustrating methods of manufacturing semiconductor devices according to still other example embodiments of the inventive concepts. With respect to the example embodiments of FIGS. 15-17 and the example embodiments of FIGS. 1-10, like reference numerals may denote like elements, and the description of like elements may be omitted.

According to at least one example embodiment, as illustrated in FIG. 11, a sacrificial insulation pattern 151 may be formed on the etch stop layer 140. At least portions of the etch stop layer 140, the first and second spacers SP1 and SP2, and the capping patterns 115, which may include silicon nitride, may be removed at the same time by an anisotropic and/or isotropic etch process. As illustrated in FIG. 15, an upper surface of the gate pattern 113 may be exposed, and an upper surface of the sidewall of the etch stop pattern 141 may be positioned lower than the upper surface of the gate pattern 113. An extended gap region may be formed between the gate stacks 110. Because the sacrificial insulation pattern 151 is used as an etch mask, when the upper surface of the gate pattern 113 is exposed, the etch stop pattern 141 covering the heavily doped impurity region 133 (e.g., a silicide layer 135) may be formed between the gate structures.

Referring to FIG. 16, a gap fill insulation pattern 155 filling the extended gap region between the gate stacks 110 may be formed. The gap fill insulation pattern 155 may include, for example, the same insulation material as the sacrificial insulation pattern 151. The upper surface of the gate pattern 113 may be exposed by planarizing the gap fill insulation layer 153 to form the gap fill insulation pattern 155. The gap fill insulation pattern 155 may cover the etch stop pattern 141 and the first and second spacers SP1 and SP2. As described with reference to FIG. 8, a trench 156 may be formed by removing the gate pattern 113. Referring to FIG. 17, a metal gate electrode 163 may be formed in the trench 156.

Figure 18:
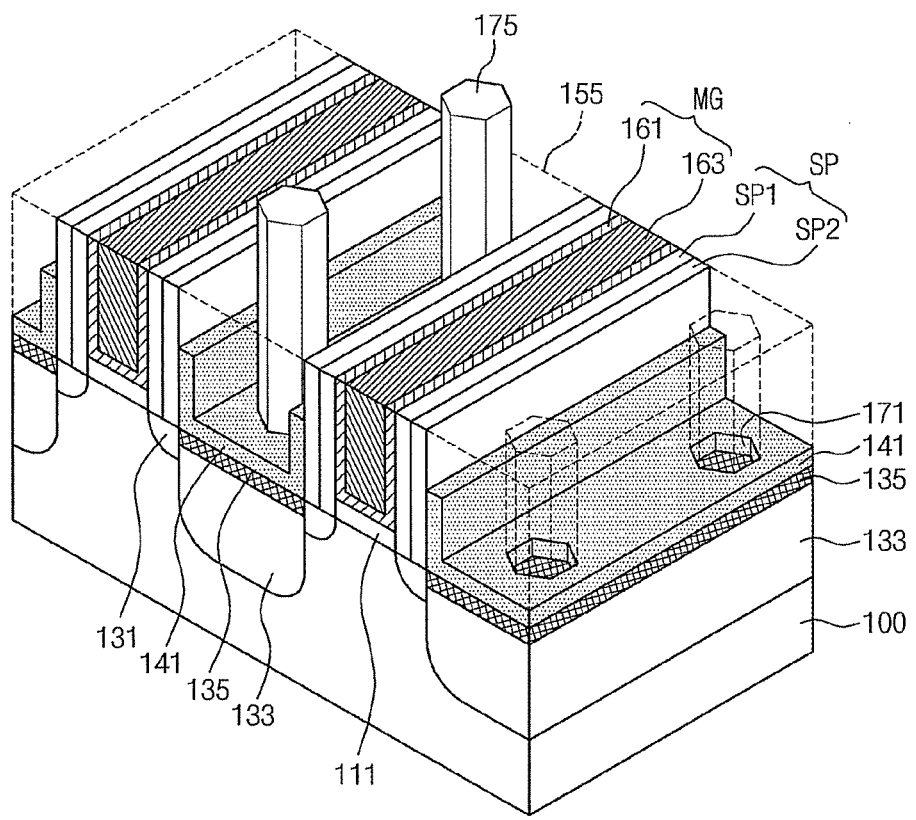
FIG. 18 is a perspective view illustrating semiconductor devices according to further example embodiments of the inventive concepts.

FIG. 18 is a perspective view illustrating semiconductor devices according to further example embodiments of the inventive concepts FIGS. 19-25 are cross-sectional diagrams illustrating semiconductor devices according to various example embodiments of the inventive concepts. Referring to FIG. 18, a semiconductor device according to at least one example embodiment may include a metal gate electrode MG on a semiconductor substrate 100, impurity regions 131 and 133 in the semiconductor substrate 100 at both sides of the metal gate electrode MG, an etch stop pattern 141 covering spacer structures (SP) at both sides of the metal gate electrode MG, the impurity regions 131 and 133, and a portion of sides of the spacer structures SP.

The semiconductor substrate 100 may include an active region defined by a device isolation layer (not shown). The semiconductor substrate 100 may include wells (not shown) doped with an n-type or p-type impurity in order to form NMOS and PMOS transistors. The plurality of metal gate electrodes MG may be disposed on the active region, and a gate insulation pattern 111 may be between the semiconductor substrate 100 and the metal gate electrodes MG. The n-type and p-type impurity regions 131 and 133 may be in the semiconductor substrate 100 at the both sides of the metal gate electrodes MG. Spacer structures SP may be on the semiconductor substrate 100 at the both sides of the metal gate electrodes MG.

The impurity regions 131 and 133 may include a lightly doped impurity region 131 and a heavily doped impurity region 133. A silicide layer 135 may be on the surface of the heavily doped impurity region 133. According to at least one example embodiment, the lightly doped impurity region 131 may be aligned with a sidewall of the metal gate electrode MG, and/or a sidewall of a first spacer SP1. The heavily doped impurity region 133 may be aligned with a sidewall of a second spacer SP2. The spacer structure SP may include a first spacer SP1 covering the sidewall of the metal gate electrode MG, and the second spacer SP2 covering the sidewall of the first spacer SP1. The first and second spacers SP1 and SP2 may cover a portion of the semiconductor substrate 100. For example, the first and second spacers SP1 and SP2 may be "L" shaped. Spacer structures SP spaced apart to face each other may be disposed between the adjacent metal gate electrodes MG.

An etch stop pattern 141 may be on the semiconductor substrate 100 between the metal gate electrodes MG. The etch stop pattern 141 may include a bottom portion covering the heavily doped impurity region 133 and a sidewall portion extending from the bottom portion to cover a portion of the sidewall of the second spacer SP2. The bottom portion of the etch stop pattern 141 may cover the silicide layer 135 on the heavily doped impurity region 133. An upper surface of the sidewall portion of the etch stop pattern 141 may be positioned lower than the upper surface of the metal gate electrode MG. A height of the sidewall portion of the etch stop pattern 141 (e.g., a distance from an upper surface of the bottom portion of the etch stop pattern 141 to the upper surface of the sidewall portion) may vary. For example, the distance from an upper surface of the bottom portion of the etch stop pattern 141 to the upper surface of the sidewall portion may be about 0% to about 80% of a distance from the upper surface of the substrate 100 to the upper surface of the metal gate.

The upper surface of the sidewall portion of the etch stop pattern 141 may be positioned lower than the upper surfaces of the spacers SP1 and SP2. The bottom portion of the etch stop pattern 141 may cover the entire surface of the heavily doped impurity region 133 (e.g., the silicide layer 135). Between the adjacent metal gate electrodes MG, an area of the region overlapping between the etch stop pattern 141 and the semiconductor substrate 100 may be larger than an area of the region overlapping between the spacer structure SP and the semiconductor substrate 100. The etch stop pattern 141 between a metal gate electrode MG and the device isolation layer may extend to the device isolation layer.

The first and second spacers SP1 and SP2 and the etch stop pattern 141 may include a silicon nitride layer with hydrogen. A hydrogen content of the first and second spacers SP1 and SP2, and the etch stop pattern 141 may be different from each other. For example, the hydrogen content in the etch stop pattern 141 may be greater than the hydrogen content in the first and second spacers SP1 and SP2. The etch stop pattern 141 may be thicker than the first and second spacers SP1 and SP2.

A contact hole 171 through which a contact plug 175 penetrates may be in the etch stop pattern 141. An area of the contact hole 171 may be substantially the same as a cross-sectional area of the contact plug 175. Because the contact plug 175 penetrates the etch stop pattern 141, the contact plug 175 may directly contact the etch stop pattern 141. The contact plug 175 may penetrate a sacrificial insulation pattern (not shown) and a gap fill insulation pattern 155 on the etch stop pattern 141, and may be connected to the silicide layer 135 under the etch stop pattern 141.

The sacrificial insulation pattern and gap fill insulation pattern 155 may be on the etch stop layer 141. The sacrificial insulation pattern and gap fill insulation pattern 155 may include the same material (e.g., may be silicon oxide). An interface may not be formed between the sacrificial insulation pattern and gap fill insulation pattern 155. An upper surface of the gap fill insulation pattern 155 may be at the same plane as the upper surface of the metal gate electrode MG. The gap fill insulation pattern 155 may cover the upper surface of the sidewall portion of the etch stop pattern 141. Between the adjacent metal gate electrodes MG, a width of the gap fill insulation pattern 155 may be greater than that of the sacrificial insulation pattern. The gap fill insulation pattern 155 may bury the etch stop pattern 141 between the adjacent metal gate electrodes MG.

The metal gate electrode MG may be on the gate insulation pattern 111 between the first spacers SP1. According to at least one example embodiment, the metal gate electrode MG may include a barrier metal layer 161 and a metal pattern 163. The metal pattern 163 may include a metallic material, for example, tungsten, copper, hafnium, zirconium, titanium, tantalum, aluminum, ruthenium, palladium, platinum, cobalt, and/or nickel. The barrier metal layer 161 may extend from between the metal pattern 163 and the gate insulation pattern 111 to between the metal pattern 163 and the first spacer SP1. The barrier metal layer 161 may include a conductive metal nitride, for example, a titanium nitride, a tantalum nitride, a tungsten nitride, a hafnium nitride, and/or a zirconium nitride. According to at least one other example embodiment, as illustrated in FIG. 19, the metal gate electrode MG may also include a polysilicon pattern 114 between the gate insulation pattern 111 and the metal pattern 163.

Figure 20:
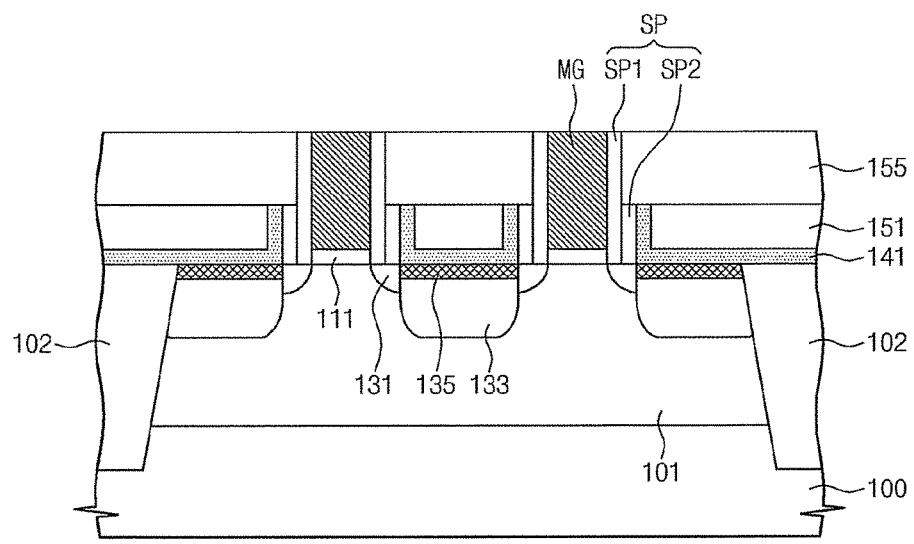

Referring to FIG. 20, according to at least one example embodiment, a spacer structure SP may include first and second spacers SP1 and SP2, in which the second spacer SP2 may cover a portion of the sidewall of the first spacer SP1. The upper surface of the second spacer SP2 may be lower than the upper surface of the metal gate electrode MG. The second spacer SP2 and the etch stop pattern 141 may include a material with etch selectivity to the first spacer SP1. For example, the second spacer SP2 and the etch stop pattern 141 may be, for example, a silicon nitride layer including hydrogen, in which a hydrogen content of the second spacer SP2 and a hydrogen content of the etch stop pattern 141 may be greater than a hydrogen content of the first spacer SP1. When the upper surface of the second spacer SP2 is positioned lower than the upper surface of the metal gate electrode MG, the gap fill insulation pattern 155 may cover the upper surface of the sidewall portion of the etch stop pattern 141 and the upper surface of the second spacer SP2.

Figure 21:
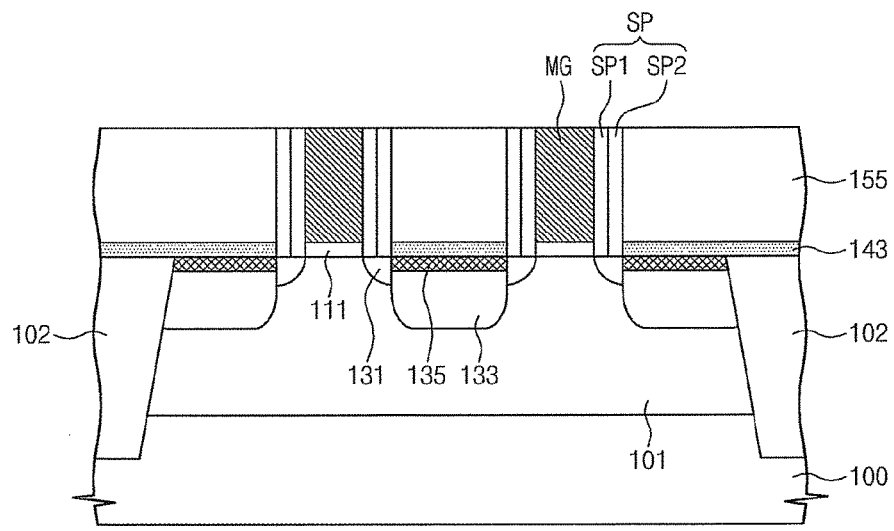
Figure 22:
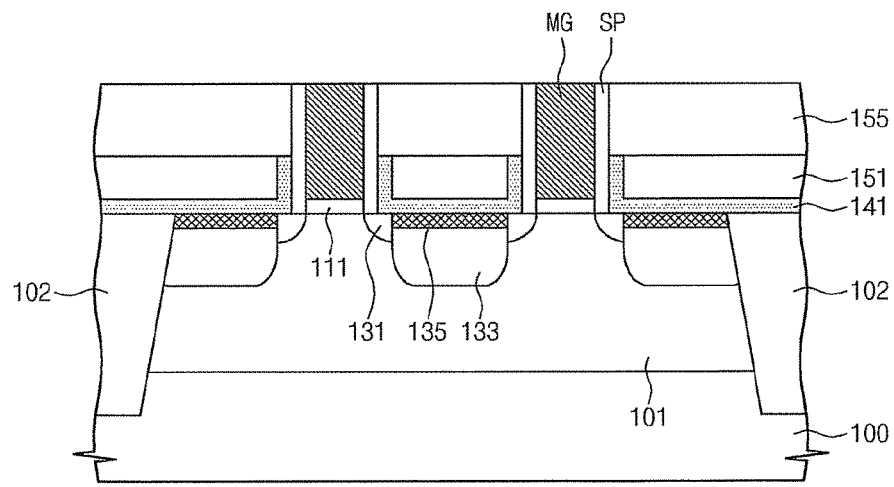

Referring to FIG. 21, according to at least one example embodiment, an etch stop pattern 143 covering the upper surface of the silicide layer 135 may include a bottom portion parallel to the semiconductor substrate 100 without a sidewall portion having a slope with respect to the semiconductor substrate 100. Referring to FIG. 22, according to at least one example embodiment, a spacer structure SP at the both sides of the metal gate electrode MG may include a first spacer SP1. The sidewall portion of the etch stop pattern 141 may cover a portion of a sidewall of the first spacer SP1.

Figure 23:
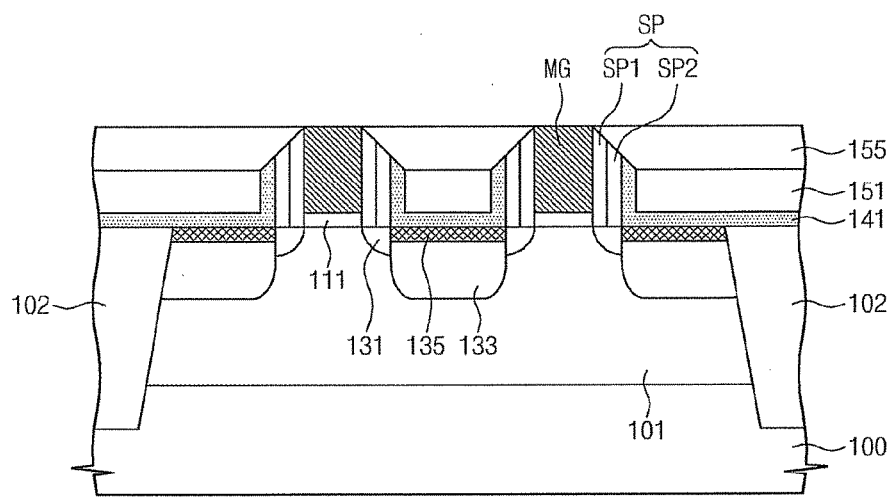

Referring to FIG. 23, according to at least one example embodiment, a spacer structure SP may include first and second spacers SP1 and SP2, in which heights of the first and second spacers SP1 and SP2, and a height of a sidewall portion of an etch stop pattern 141 may be different from each other. For example, the height of the sidewall portion of the etch stop pattern 141 may be less than the height of the second spacer SP2, and the height of the first spacer SP1 may be greater than the height of the second spacer SP2. The first spacer SP1 may cover the entire sidewall of the metal gate electrode MG. According to example embodiments illustrated in FIG. 22, the gap fill insulation pattern 155 may cover upper surfaces of the first and second spacers SP1 and SP2 and the etch stop pattern 141.

Figure 24:
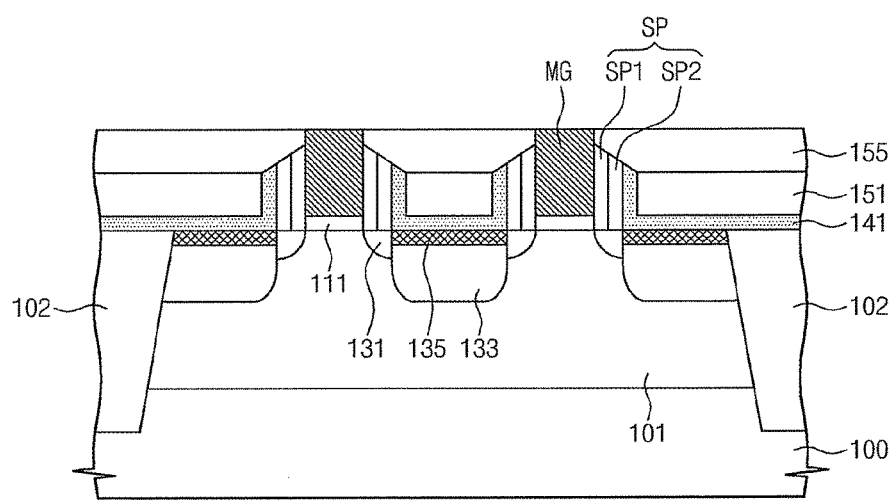

Referring to FIG. 24, according to at least one example embodiment, heights of first and second spacers SP1 and SP2, and a height of a sidewall portion of an etch stop pattern 141 may be different from each other, and upper surfaces of the first and second spacers SP1 and SP2 and the etch stop pattern 141 may be lower than the upper surface of the metal gate electrode MG. A gap fill insulation layer 155 may cover the upper surfaces of the first and second spacers SP1 and SP2 and the etch stop pattern 141, and may directly contact one sidewall of the metal gate electrode MG.

Figure 25:
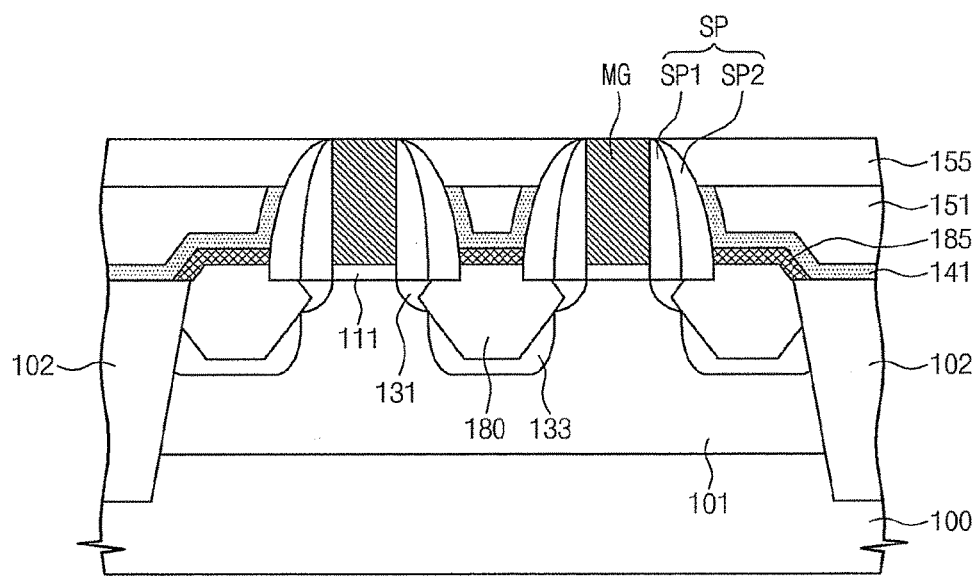

Referring to FIG. 25, according to at least one example embodiment, a semiconductor device may include a source/drain region protruding at both sides of the metal gate electrode MG. A semiconductor layer 180, which may protrude from inside the semiconductor substrate 100 to over the surface of the substrate 100, may be at both the sides of the metal gate electrode MG. For example, an upper surface of the semiconductor layer 180 may be higher than the upper surface of the gate insulation pattern 111. The semiconductor layer 180 may be the same conductive type as the impurity regions 131 and 133, and may be formed of a semiconductor material with a lattice constant different from a semiconductor material constituting the semiconductor substrate 100. For example, the semiconductor layer 180 may be formed of silicon germanium and/or silicon carbide.

According to an example embodiment illustrated in FIG. 25, a silicide layer 185 may be disposed between an upper portion of the semiconductor layer 180 and an etch stop pattern 141. The bottom portion of the etch stop pattern 141 may cover the semiconductor layer 180. The sidewall portion of the etch stop pattern 141 may extend from the bottom portion to cover a portion of a sidewall of a spacer structure SP. An upper surface of the sidewall portion of the etch stop pattern 141 and a lower surface of the etch stop pattern 141 may be positioned lower than the upper surface of the metal gate electrode MG. The lower surface of the etch stop pattern 141 may be positioned between the upper surface of the gate insulation pattern 111 and the upper surface of the metal gate electrode MG.

Figure 26:
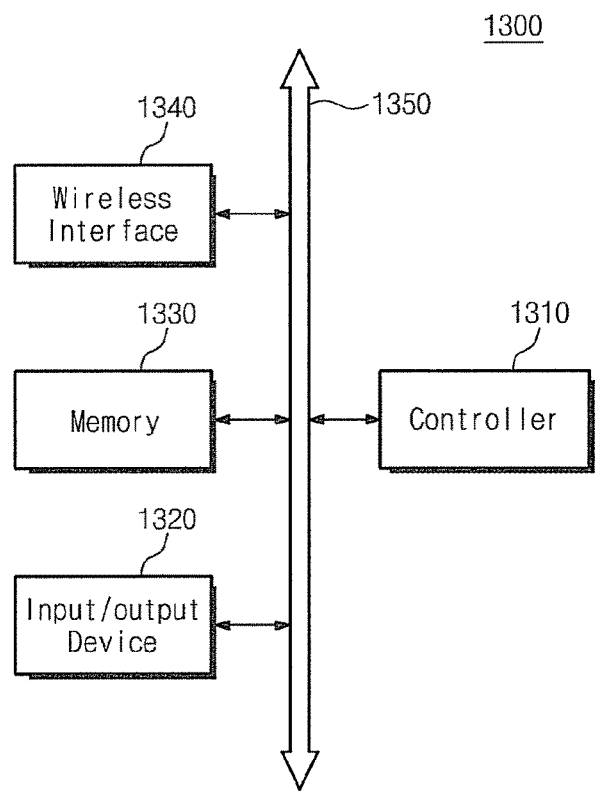
FIGS. 26 and 27 illustrate example implementation embodiments.
Figure 27:
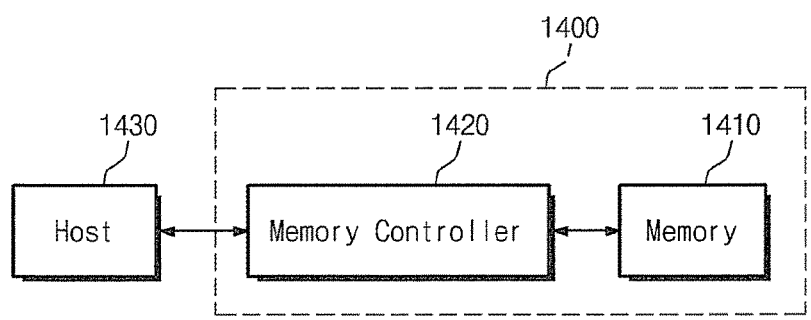

FIGS. 26 and 27 are drawings for schematically explaining electronic devices including semiconductor devices in accordance with some embodiments of the inventive concept.

Referring to FIG. 26, an electronic device 1300 including a vertical channel transistor in accordance with the some embodiments of the inventive concept may be may be a PDA, a laptop computer, a portable computer, a web tablet, a wireless phone, a cell phone, a digital music player, a wire/wireless electronic device or one of composite electronic devices including at least two those devices. The electronic device 1300 may include a controller 1310, an input/output device 1320 such as a keypad, a keyboard, a display, etc., a memory 1330 and a wireless interface 1340 that are combined with one another through a bus 1350. The controller 1310 may include, for example, one or more microprocessors, digital signal processors, micro controllers, or something like that. The memory 1330 may be used to store commands executed by the controller 1310. The memory 1330 may be used to store user data. The memory 1330 may include a vertical channel transistor in accordance with the some embodiments of the inventive concept. The electronic device 1300 may use the wireless interface 1340 to transmit data to a wireless communication network communicating using a RF signal and/or receive data from the network. For example, the wireless interface 1340 may include an antenna, a wireless transceiver, etc. The electronic device 1300 may be used in a communication interface protocol of a third generation such as CDMA, GSM, NADC, E-TDMA, CDMA2000.

Referring to FIG. 27, the semiconductor devices in accordance with embodiments of the inventive concept may be used to embody a memory system. The memory system 1400 may include a memory device 1410 to store huge amounts of data and a memory controller 142. The memory controller 142 controls the memory device 1410 to read data from the memory device 1410 or write data in the memory device 1410 in response to a read/write request of a host 1430. The memory controller 1420 may constitute an address mapping table to map an address provided from a mobile device or a computer system into a physical address of the memory device 1410. The memory device 1410 may include the semiconductor devices in accordance with embodiments of the inventive concept.

According to example embodiments of the inventive concepts, semiconductor devices may include an etch stop pattern covering source/drain regions at a level lower than an upper surface of a metal gate electrode. Therefore, when source/drain electrodes are formed on a semiconductor substrate and a metal gate electrode is formed, partial etch of the etch stop layer that generates a process failure may be prevented.

While example embodiments have been particularly shown and described, it will be understood by one of ordinary skill in the art that variations in form and detail may be made therein without departing from the spirit and scope of the claims.

What is claimed is:

1. A semiconductor device, comprising:
a substrate;
a gate stack disposed on the substrate;
a spacer disposed on a sidewall of the gate stack;
an etch stop pattern disposed on the substrate and disposed on a sidewall of the spacer; and
an insulation pattern disposed on the etch stop pattern, wherein
the etch stop pattern includes silicon nitride,
a top surface of the spacer is inclined with respect to a top surface of the gate stack,
at least a portion of the top surface of the spacer is disposed lower than the top surface of the gate stack,
a top surface of the etch stop pattern is inclined with respect to the top surface of the gate stack,
the spacer includes a first spacer disposed on the sidewall of the gate stack and a second spacer disposed on a sidewall of the first spacer,
the first spacer includes a first nitride spacer and a first oxide spacer,
the second spacer includes a second nitride spacer and a second oxide spacer,
the first oxide spacer is L-shaped, and
the second oxide spacer is L-shaped.

2. The semiconductor device of claim 1, wherein
the gate stack includes a gate insulation pattern and a metal gate electrode disposed on the gate insulation pattern,
the top surface of the spacer is inclined in a straight line with respect to the top surface of the gate stack, and
the top surface of the etch stop pattern is inclined in a straight line with respect to the top surface of the gate stack.

3. The semiconductor device of claim 1, wherein a bottom surface of the first spacer is higher than a bottom surface of the second spacer.

4. The semiconductor device of claim 1, wherein a top surface of the first spacer is higher than a top surface of the second spacer.

5. The semiconductor device of claim 1, further comprising a third spacer disposed on a sidewall of the second spacer.

6. The semiconductor device of claim 1, wherein the substrate includes an n-type well and/or a p-type well.

7. The semiconductor device of claim 1, further comprising a silicide layer on which the etch stop pattern is disposed.

8. The semiconductor device of claim 1, wherein the insulation pattern includes a first insulation pattern disposed on the etch stop pattern and a second insulation pattern disposed on the first insulation pattern, and
a top surface of the second insulation pattern is co-planar with the top surface of the gate stack.

9. The semiconductor device of claim 1, wherein the etch stop pattern does not contact with the gate stack.

10. The semiconductor device of claim 1, wherein
the etch stop pattern includes a first portion that extends parallel to a sidewall of the gate stack,
the top surface of the etch stop pattern that is inclined with respect to the top surface of gate stack is a top surface of the first portion of the etch stop pattern,
the etch stop pattern includes a second portion that extends perpendicular from the first portion of the etch stop pattern, and
a bottom surface of the second portion of the etch stop pattern is below a bottom surface of the first nitride spacer.

11. A semiconductor device comprising:
a substrate;
a gate stack disposed on the substrate;
a spacer disposed on a sidewall of the gate stack;
an etch stop pattern disposed on the substrate and disposed on a sidewall of the spacer,
a first insulation pattern disposed on the etch stop pattern; and
a second insulation pattern disposed on the first insulation pattern, the etch stop pattern and the spacer,
wherein at least a portion of the second insulation pattern is disposed lower than a top surface of the gate stack,
wherein a material of the second insulation pattern is different than a material of the first insulation pattern,
wherein the second insulation pattern is in direct contact with a top surface of the spacer, wherein the top surface of the spacer is inclined in a straight direction with respect to the top surface of the gate stack, and wherein a portion of a top surface of the first insulation pattern is sloped downward.

12. The semiconductor device of claim 11, wherein both the etch stop pattern and the spacer include silicon nitride.

13. The semiconductor device of claim 11, wherein the gate stack includes a gate insulation pattern and a metal gate electrode disposed on the gate insulation pattern.

14. The semiconductor device of claim 13, wherein the gate insulation pattern includes a high-k dielectric layer.

15. The semiconductor device of claim 11, wherein a top surface of the second insulation pattern is co-planar with the top surface of the gate stack.

16. The semiconductor device of claim 11, wherein the spacer includes a first spacer disposed on the sidewall of the gate stack and a second spacer disposed on a sidewall of the first spacer.

17. The semiconductor device of claim 16, wherein a bottom surface of the gate stack is co-planar with a bottom surface of the first spacer.

18. The semiconductor device of claim 11, wherein a bottom surface of the etch stop pattern is lower than a bottom surface of the gate stack.

19. The semiconductor device of claim 11, wherein a top surface of the first insulation pattern is lower than the top surface of the gate stack, and the first insulation pattern is separated from the spacer.

20. A semiconductor device comprising:
a substrate;
a gate stack disposed on the substrate;
a spacer disposed on a sidewall of the gate stack;
a protection pattern disposed on the substrate and disposed on a sidewall of the spacer;
a first insulation pattern disposed on the protection pattern; and
a second insulation pattern disposed on the first insulation pattern, the protection pattern, and the spacer, wherein a material of the second insulation pattern is different than a material of the first insulation pattern, wherein the second insulation pattern has a flat top surface and an inclined bottom surface inclined with respect to the flat top surface, the inclined bottom surface of the second insulation pattern is in direct contact with a top surface of the spacer and a top surface of the protection pattern, and the flat top surface of the second insulation pattern is located at a same level with a top surface of the gate stack, wherein the top surface of the protection pattern is disposed lower than the top surface of the gate stack and the flat top surface of the second insulation pattern.

21. The semiconductor device of claim 20, wherein at least a portion of the second insulation pattern is lower than the top surface of the protection pattern and lower than the top surface of the gate stack, the spacer includes a first spacer disposed on the sidewall of the gate stack and a second spacer disposed on a sidewall of the first spacer, the first spacer includes a first nitride spacer, and the second spacer includes a second nitride spacer.

22. The semiconductor device of claim 20, wherein the top surface of the spacer is lower than the top surface of the gate stack.

* * * * *